United States Patent [19]

Kawabe et al.

[11] Patent Number: 5,707,776
[45] Date of Patent: Jan. 13, 1998

[54] POSITIVE RESIN COMPOSITION SENSITIVE TO ULTRAVIOLET RAYS

[75] Inventors: Yasumasa Kawabe; Tsukasa Yamanaka; Toshiaki Aoai, all of Haibara-gun, Japan

[73] Assignee: Fuji Photo Film Co., LTD., Kanagawa, Japan

[21] Appl. No.: 438,481

[22] Filed: May 10, 1995

[30] Foreign Application Priority Data

May 12, 1994 [JP] Japan .................. 6-098671

[51] Int. Cl.$^6$ .................................. G03C 1/73
[52] U.S. Cl. ............... 430/270.1; 430/920; 430/921; 430/905; 430/171; 430/176; 522/166
[58] Field of Search ................. 430/270, 920, 430/921, 905, 171, 176; 522/166

[56] References Cited

FOREIGN PATENT DOCUMENTS

| | | |
|---|---|---|
| 5-323602 | 12/1993 | Japan . |
| 5323602 | 12/1993 | Japan .............................. G03F 7/022 |
| 6-266107 | 9/1994 | Japan . |
| 6-336560 | 12/1994 | Japan . |
| 7-10961 | 1/1995 | Japan . |

*Primary Examiner*—George F. Lesmes
*Assistant Examiner*—Laura Wiener
*Attorney, Agent, or Firm*—Sughrue, Mion, Zinn, Macpeak & Seas, PLLC

[57] ABSTRACT

Disclosed is a positive radiation-sensitive resist composition comprising polymer(s) of the following general formula (1) and a radiation-sensitive agent.

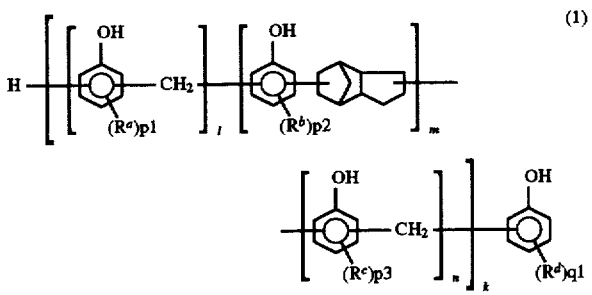

Ra, Rb, Rc and Rd each are independently a hydrogen atom, a hydroxyl group, a halogen atom, an alkyl group, an alkoxy group, an alkenyl group, an aryl group, an aralkyl group, an alkoxycarbonyl group, an arylcarbonyl group, an acyloxy group, an acyl group, or a cycloalkyl group; k is an integer of from 1 to 30; (1+n) is an integer of from 1 to 100; m is an integer of from 1 to 50; p1, p2 and p3 each are an integer of from 1 to 3; q1 is an integer of from 1 to 4. The resist composition has high resolution to give resist patterns with good profiles and has high heat resistance and good storage stability.

13 Claims, No Drawings

POSITIVE RESIN COMPOSITION SENSITIVE TO ULTRAVIOLET RAYS

FIELD OF THE INVENTION

The present invention relates to a positive radiation-sensitive resin composition which is used for manufacture of semiconductor devices such as lithographic plates, ICs, etc., manufacture of circuit substrates for liquid crystal displays, thermal heads, etc., and other photofabrication processes, etc. More precisely, it relates to a positive radiation-sensitive resin composition which is sensitive to ultraviolet rays such as i-ray, etc., far-ultraviolet rays such as excimer laser rays (XeCl, KrF, ArF), etc. and which is especially suitable as a resist for formation of large-scale integration circuits.

BACKGROUND OF THE INVENTION

According to a conventional process for producing semiconductor integration circuits, a resist is coated on a substrate such as a silicon wafer or the like, this is exposed to a radiation through a mask and developed to form a fine pattern on the substrate, and thereafter the part other than the pattern part of the substrate is etched. At present, negative and positive resists are known. Since negative resists have limited resolution, positive resists are essentially used for fine processing.

Positive photoresist compositions generally comprise an alkali-soluble resin and, as a photosensitive substance, a naphthoquinonediazide compound. For instance, compositions comprising a novolak phenolic resin and a substituted naphthoquinonediazide compound are disclosed in U.S. Pat. Nos. 3,666,473, 4,115,128 and 4,173,470. As the most typical compositions, examples comprising cresol-formaldehyde novolak resins and trihydroxybenzophenone-1,2-naphthoquinonediazido-sulfonates are disclosed in L. F. Thompson, Introduction to Microlithography (published by ACS, No. 219, pp. 112–121).

In such positive photoresists basically comprising a novolak resin and a quinonediazide compound, the novolak resin is highly resistant to plasma etching while the naphthoquinonediazide compound acts as a dissolution inhibitor. The naphthoquinonediazide compound characteristically gives a carboxylic acid, when exposed to light, to lose its dissolution-inhibiting activity, thereby making the novolak resin have elevated solubility in alkalis.

In view of these, many positive photoresists containing a novolak resin and a naphthoquinonediazide-based photosensitive component have heretofore been developed and put to practical use. These have produced sufficient results in forming line patterns on a level of approximately from 0.8 μm to 2 μm.

However, the degree of integration in integrated circuits is desired to be increased more and more in these days, and it has become necessary to produce ultra-fine patterns having a line width of a half-micron or less in the production of semiconductor substrates for ultra-LSIs. In order to attain the necessary resolution, the wavelength of the light to be used in the exposure devices for photolithography is needed to be shortened more and more. At present, far-ultraviolet rays and excimer rays (XeCl, KrF, ArF, etc.) have become used for this purpose.

With the recent development of larger scale integration circuits, a dry etching system is now employed for etching wafers, in place of the conventional wet etching system. Therefore, the photoresists to be used in said system are required to have dry-etching resistance and heat resistance.

The conventional resists comprising a novolak resin and a naphthoquinonediazide compound have good dry-etching resistance and heat resistance. However, when these are used in lithographic patterning with far-ultraviolet rays or excimer laser rays, the rays do not reach the bottom of the resist coat since the novolak resin and the naphthoquinonediazide compound therein strongly absorb rays falling within a far-ultraviolet range, with the result that only tapered patterns are obtained at low sensitivity.

In order solve this problem, radiation-sensitive materials, especially resins that hardly absorb light falling within a far-ultraviolet range and have high light transmittance are required. As substances having high light transmittance in a far-ultraviolet range, known are poly(p-hydroxystyrene) and acrylic or methacrylic acid derivatives.

Poly(p-hydroxystyrene) has good heat resistance and dry-etching resistance, as described in U.S. Pat. No. 4,439,516, Technical Papers on SPE Regional Technical Conference of Photopolym., 35 (1985), Proc. SPIE, 920, 242 (1988), European Patent 271,708, etc. However, when this is combined with a naphthoquinonediazide-based photosensitive component, the combined resist is defective in that the difference in the dissolving speed between the exposed area and the non-exposed area is small with the result that the resists do not have high resolution, as described in Proc. SPIE, 771, 136 (1987).

In addition, poly(p-hydroxystyrene) has another drawback in that it dissolves in alkali developers at a much higher dissolving speed than novolak resins, and such a high dissolving speed of this compound is unallowable.

As a means of controlling such excess solubility of poly(p-hydroxystyrene) in alkalis, copolymerization of this compound with an alkali-insoluble monomer and substitution of the nucleus or the hydroxyl group of this compound by hydrophobic group(s) are effective. For instance, known are copolymerization with maleimide or styrene (see JP-A 63-130604; the term "JP-A" as used herein means an "unexamined published Japanese patent application"); addition of styrene to the nucleus (see JP-A 62-53303); 3,5-dimethyl or dibromo substitution (see European Patent 307, 752, JP-A 2-166105); esterification with benzoic acid (see JP-A 62-227143); partial trimethylsilyl etherification (see Proc. SPIE, 811, 186 (1987)); o-nitrobenzyl etherification (see JP-A 62-69263), etc.

In addition, also known are partial crosslinking of poly (p-vinylphenol) with dimethylol-p-cresol or hexamine (see U.S. Pat. No. 4,600,683), and modification of poly(p-hydroxystyrene), etc. with hydroxymethylphenol derivatives, etc. to give modified resins (see JP-A 5-107763, 5-43641).

Resins of acrylic or methacrylic acid derivatives are substantially transparent in a far-ultraviolet range and are therefore ideal. However, since these do not contain aromatic rings but are aliphatic, resists containing them as a binder resin have extremely poor dry-etching resistance.

Also known are hydrogenated alkali-soluble resins having improved transparency in a far-ultraviolet range (see JP-A 2-4254, 2-103048, 3-87746, 3-107160), and polymers of o- and/or m-hydroxystyrene and their derivatives capable of making a large difference in the dissolving speed between the exposed area and the non-exposed area (see JP-A 2-59750, 2-15267, 2-253261, 2-253262, Japanese J. Appl. Phys., Vol. 30, No. 11B, p. 3125 (1991)).

It is desired that a photosensitive agent to be in the resist also has high sensitivity in a far-ultraviolet range and may has increased transparency when bleached after exposure.

For this purpose, various photosensitive substances have heretofore been proposed in place of quinonediazide compounds.

For instance, diazomeldrum's acid (see JP-A 56-1933) has been developed, which, however, is defective in that it is volatile. As other photosensitive substances free from this drawback, there have been proposed diazohomotetraminic acid (see European Patent 129,694), diazopiperidinedione (see JP-A 2-166105), diazophenacetyldiphenylphosphineoxide (see U.S. Pat. No. 4,601,969), diazoketone derivatives of cholic acid (JP-A 64-80944), o-nitrobenzyl derivatives of cholic acid (see Polym. J., 21 (8) 603 (1989)), α-diazoacetacetates (see J. Photopolym. Sci. Tech., 2 (3) 392 (1989)), carboxylates of 2-diazocyclohexane-1,3-dione (see Proc. SPIE 920, 51 (1988)), etc.

As still another means for solving the above-mentioned problems, there have been proposed chemically-amplified resist compositions such as those described in U.S. Pat. No. 4,491,628, European Patent 249,139, JP-A 59-43439, Polym. Eng. Sci., 23 (18), 1012 (1983), etc. Chemically-amplified positive resist compositions are pattern-forming materials which give acids in the exposed areas, when exposed to radiations such as far-ultraviolet rays, etc. The active components in the compositions in the thus-exposed areas are reacted in the presence of the thus-formed acid that acts as a catalyst for the reaction, whereby the solubility in developers of the areas that have been exposed to the active radiations is made different from that of the other non-exposed areas and thus patterns are formed on substrates.

As examples of such resist compositions, mentioned are a combination of a compound capable of giving an acid by photolysis and an acetal or O,N-acetal compound (see JP-A 48-89003), a combination of the compound and an orthoester or amidacetal compound (see JP-A 51-120714), a combination of the compound and a polymer having acetal or ketal group(s) in its main chain (see JP-A 53-133429), a combination of the compound and an enol ether compound (see JP-A 55-12995), a combination of said compound and an N-acyliminocarbonic acid compound (see JP-A 55-126236), a combination of the compound and a polymer having ortho-ester group(s) in its main chain (see JP-A 56-17345), a combination of the compound and a tertiary alkyl ester compound (see JP-A 60-3625), a combination of said compound and a silyl ester compound (see JP-A 60-10247), a combination of said compound and a silyl ether compound (see JP-A 60-37549 and 60-121446), etc. These resist compositions are different from the conventional resists comprising a diazoketone or azide compound having a quantum yield of not higher than 1 as the photosensitive agent, with respect to the effect and the mechanism of themselves, since the former contains in principle, a quantum yield of higher than 1 as the photosensitive agent. Therefore, the former have higher sensitivity than the latter.

As other systems that are stable when stored at room temperature but are decomposed when heated in the presence of an acid, for example, mentioned are combinations comprising a compound capable of giving acid when exposed to light and tertiary or secondary carbon (e.g., t-butyl, 2-cyclohexenyl) esters or carbonates, such as those described in JP-A 59-45439, 60-3625, 62-229242, 63-27829, 63-36240, 63-250642; Polym. Eng. Sci., Vol. 23, p. 1012 (1983); ACS. Sym., Vol. 242, p. 11 (1984); Semiconductor World, 1987, November, p. 91; Macromolecules, Vol. 21, p. 1475 (1988); SPIE, Vol. 920, p. 42 (1988), etc. These systems also have high sensitivity and have smaller absorption in a deep-UV range than naphthoquinonediazide/novolak resin systems. Therefore, these are effectively exposed to short-wave rays.

The above-mentioned chemically-amplified positive resists are grouped into two groups. One group includes those of a two-component system comprising a compound capable of giving an acid when exposed to radiations (photo acid generator) and an alkali-soluble resin having acid-decomposing group(s) (see U.S. Pat. No. 4,491,628, etc.); and the other group includes those of a three-component system comprising an alkali-soluble resin, a photo acid generator, and a dissolution-inhibiting compound capable of being made soluble in alkalis when catalytically reacted with an acid (acid-decomposing, dissolution-inhibiting agent) (see European Patent 249,139, JP-A 2-248953, etc.). For both of these systems as well as a resist comprising a novolak resin and a naphthoquinonediazide compound, it is necessary to make a large difference in the dissolving speed between the exposed area and the non-exposed area so as to attain high resolution. Therefore, an alkali-soluble resin suitable for the positive resist compositions has been desired.

SUMMARY OF THE INVENTION

The object of the present invention is to provide a resist which is extremely effective for producing semiconductor integration circuits by ultraviolet or far-ultraviolet lithography or, that is, a radiation-sensitive resin composition having high resolution, high dry-etching resistance and high heat resistance for forming patterns with good profiles.

We, the present inventors have assiduously studied various positive photoresists, in consideration of the matters mentioned hereinabove, and have found that the above-mentioned object of the present invention can be attained by using a specific alkali-soluble resin as a binder. On the basis of this finding, we have completed the present invention.

Specifically, the object of the present invention has been attained by a positive radiation-sensitive resin composition comprising polymer(s) of the following general formula (1) and a radiation-sensitive agent.

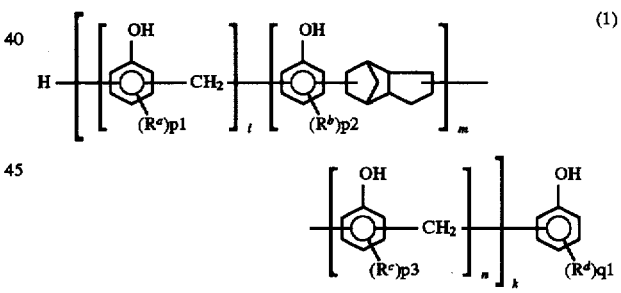

wherein $R^a$, $R^b$, $R^c$ and $R^d$ may be the same or different and each represents a hydrogen atom, a hydroxyl group, a halogen atom, an alkyl group, an alkoxy group, an alkenyl group, an aryl group, an aralkyl group, an alkoxycarbonyl group, an arylcarbonyl group, an acyloxy group, an acyl group, or a cycloalkyl group;

k represents an integer of from 1 to 30;

(1+n) is an integer of from 1 to 100;

m represents an integer of from 1 to 50;

p1, p2 and p3 each represent an integer of from 1 to 3;

q1 represents an integer of from 1 to 4.

DETAILED DESCRIPTION OF THE INVENTION

The halogen atom for $R^a$, $R^b$, $R^c$ and $R^d$ in formula (1) is preferably a chlorine atom, a bromine atom or an iodine atom; the alkyl group for them is preferably an alkyl group having from 1 to 4 carbon atoms, which includes, for example, a methyl group, an ethyl group, a propyl group, an n-butyl group, a sec-butyl group and a t-butyl group; the alkoxy group for them is preferably an alkoxy group having from 1 to 4 carbon atoms, which includes, for example, a methoxy group, an ethoxy group, a hydroxyethoxy group, a propoxy group, a hydroxypropoxy group, an isopropoxy group, an n-butoxy group, an iso-butoxy group, a sec-butoxy group and a t-butoxy group. The alkenyl group for them is preferably an alkenyl group having from 2 to 4 carbon atoms, which includes, for example, a vinyl group, a propenyl group, an allyl group and a butenyl group; the aryl group for them is preferably a phenyl group, a xylyl group, a toluyl group or a cumenyl group; the aralkyl group for them is preferably a benzyl group, a phenethyl group or a cumyl group; the alkoxycarbonyl group for them is preferably a methoxycarbonyl group or an ethoxycarbonyl group; the arylcarbonyl group for them is preferably a benzoyloxy group; the acyloxy group for them is preferably a butyryloxy group or an acetoxy group; the acyl group for them is preferably a formyl group, an acetyl group, a butyryl group, a benzoyl group, a cyanamoyl group or a valeryl group; the cycloalkyl group for them is preferably a cyclopentyl group or a cyclohexyl group.

The polymers of formula (1) for use in the present invention are novel modified phenolic resins, which are produced by block copolymerization of conventional phenol-novolak resins of the following formula (3) and dicyclopentadiene-modified phenolic resins of the following formula (2).

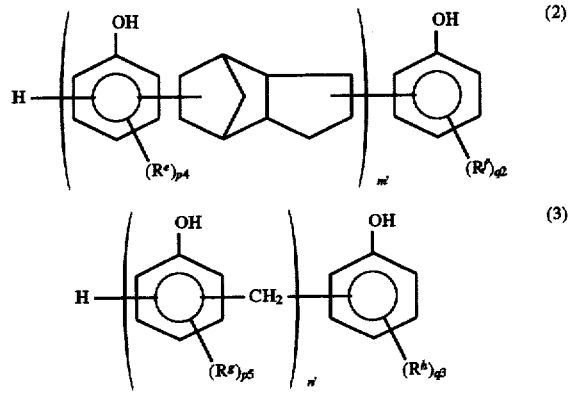

In these formulae;

$R^e$, $R^f$, $R^g$ and $R^h$ may be the same or different and each represents a hydrogen atom, a hydroxyl group, a halogen atom, an alkyl group, an alkoxy group, an alkenyl group or an aryl group;

m' represents an integer of from 1 to 50;

n' represents an integer of from 1 to 50;

p4 and p5 each represent an integer of from 1 to 3;

q2 and q3 each represent an integer of from 1 to 4.

The modified phenolic resin of formula (1) can be produced, for example, according to the following two methods. The methods are described concretely hereunder.

One method comprises copolymerizing dicyclopentadiene and excess amounts of phenols in the presence of Lewis acids (first stage reaction) followed by condensing said excess phenols and aldehydes (second stage reaction).

The cyclopentadiene may have a purity of 90 % or higher and may contain, as impurities, butadiene, isoprene, etc. Preferably, it has a purity of 95 % or higher.

As the phenols, preferably used are phenol; cresols such as m-cresol, p-cresol, o-cresol, etc.; xylenols such as 2,5-xylenol, 3,5-xylenol, 3,4-xylenol, 2,3-xylenol, etc.; alkylphenols such as m-ethylphenol, p-ethylphenol, o-ethylphenol, p-t-butylphenol, etc.; trialkylphenols such as 2,3,5-trimethylphenol, 2,3,4-trimethylphenol, etc.; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, p-butoxyphenol, etc.; as well as m-chlorophenol, p-chlorophenol, o-chlorophenol, catechol, resorcinol, hydroquinone, etc.

These phenols can be used singly or as their mixtures. These need not be particular ones but may be ordinary ones having a purity for industrial use.

As the Lewis acids to be used as the catalysts for the polymerization and the condensation, for example, mentioned are $AlCl_3$, $BF_3$, $ZnCl_2$, $H_2SO_4$, $TiCl_4$, $H_3PO_4$, etc. These catalysts can be used singly or as their mixtures. Preferably, $BF_3$ is used singly.

As the aldehydes, for example, usable are paraformaldehyde, an aqueous solution of formaldehyde, etc. When paraformaldehyde is used, it is dissolved in a solvent and the resulting solution is dropwise added to the reaction system, or the solid of itself is added thereto several times. When an aqueous solution of formaldehyde is used, its concentration is not specifically defined but the solution may contain the necessary amount of the active ingredient to be added to the reaction system.

The polymerization of dicyclopentadiene and phenols in the first stage reaction is conducted while they are melted or they are in an appropriate solvent. As usable solvents, for example, mentioned are benzene, toluene, xylene, etc. To carry out the polymerization, Lewis acids may be dropwise added to the mixture comprising dicyclopentadiene and phenols, or dicyclopentadiene may be dropwise added to the mixture comprising phenols and Lewis acids. The time for the dropwise addition may be from several minutes to several hours. After the dropwise addition, the reaction is continued for further several hours. The reaction temperature is preferably from 20° to 180° C., more preferably from 60° to 120° C.

The condensation of the remaining phenols and aldehydes in the second stage reaction may be conducted directly after the first stage reaction in a molten condition or in a suitable solvent. At this stage, another solvent may be added to the second stage reaction system. Such additional solvents may be, as well as the above-mentioned solvents, methanol, ethanol, acetone, methyl ethyl ketone, methyl isobutyl ketone, tetrahydrofuran, etc. A small amount of water may be added to this reaction system by which the existing Lewis acids are decomposed. An acid catalyst such as Lewis acids, hydrochloric acid, phosphoric acid, oxalic acid, etc. may be added to this reaction system.

As the aldehydes, for example, usable are paraformaldehyde, an aqueous solution of formaldehyde, etc. When paraformaldehyde is used, it is dissolved in a solvent and the resulting solution is dropwise added to the reaction system, or the solid of itself is added thereto several times. When an aqueous solution of formaldehyde is used, it may be dropwise added to the reaction system over a period of from several minutes to several hours. The reaction temperature may be the same as that at which the first stage reaction is conducted, or may be different from the latter.

As mentioned above, this method is characterized in that the first stage reaction for polymerizing dicyclopentadiene and phenols to give dicyclopentadiene-modified phenolic resins is successively followed by the second stage reaction for condensing phenols and aldehydes. After this process, the remaining phenols are removed from the reaction mixture by distillation under reduced pressure, the reaction mixture is diluted with a solvent to have a pre-determined concentration, and this is then washed with ion-exchanged water to essentially remove ions therefrom. Afterwards, the solvents used for the reaction and the washing are removed from this by distillation under reduced pressure. Then, this is cooled. Thus, the intended modified phenolic resin which is solid is obtained.

Next, the other method is referred to, which is to obtain the novel modified phenolic resin by copolycondensing a dicyclopentadiene-modified phenolic resin of formula (2) with phenols and aldehydes added thereto, in the presence of an acid catalyst.

As dicyclopentadiene, phenols and aldehydes to be used in this method, those mentioned hereinabove are referred to. As the acid catalyst, usable are hydrochloric acid, phosphoric acid, oxalic acid, sulfuric acid, etc. The reaction may be conducted in a molten condition or in a solvent. Aldehyde is added to a mixture comprising a dicyclopentadiene-modified phenolic resin and phenol. The addition of aldehyde may be effected in the same manner as that mentioned above. The reaction temperature may be from 20° to 180° C., preferably from 60° to 120° C. Aldehyde is added to the mixture over a period of from several minutes to several hours. If aldehydes of large amounts are added, it is desirable that they are added slowly in such a degree that the addition does not cause any rapid generation of heat. After the reaction, the non-reacted phenols are removed by distillation, the reaction mixture is washed and the used solvents are removed in the same manner as in the above. Thus, the intended modified phenolic resins which is solid is obtained.

The molecular weight of the polymer for use in the present invention is measured by gel permeation chromatography (GPC) and is defined in terms of the molecular weight of polystyrene. The polymer preferably has a number average molecular weight of from 300 to 10,000, more preferably from 500 to 5,000. If the polymer has a number average molecular weight of less than 300, the heat resistance is low, and the decrease in the thickness of the resist film in the non-exposed areas is large after the film is developed. On the other hand, if the polymer has a number average molecular weight of more than 10,000, the developing rate is lowered. The polymer may have different molecular weights, depending on the reaction conditions and also on the conditions for fractionating and re-precipitating.

The polymers may also have various degrees of dispersion. The degree of dispersion of the polymer is represented by (weight average molecular weight/number average molecular weight). It is preferred that the polymer for use in the present invention has a smaller degree of dispersion.

According to the present invention, it is desired that the polymer of formula (1) is used as the binder. If desired, the binder may comprise, in addition to the polymers of formula (1), other alkali-soluble polymer(s) compatible with the polymer of formula (1).

As such alkali-soluble polymers usable in the present invention, for example, mentioned are novolak resins, hydrogenated novolak resins, acetone-pyrogallol resins, polyhydroxystyrenes, partially hydrogenated polyhydroxystyrene resins, halogeno- or alkyl-substituted polyhydroxystyrenes, hydroxystyrene-N-substituted maleimide copolymers, partially O-alkylated or O-acylated polyhydroxystyrenes, styrene-maleic anhydride copolymers, etc. However, these are not limitative. Of these alkali-soluble polymers, especially preferred are novolak resins, partially hydrogenated novolak resins, polyhydroxystyrenes, and partially hydrogenated polyhydroxystyrene resins. The alkali-soluble polymer may be added to the polymer of formula (1) generally in an amount of from 0.1 to 100 parts by weight, preferably from 1 to 50 parts by weight, per 100 parts by weight of the polymer of formula (1). If the proportion of the polymer of formula (1) of this invention is too small, it is impossible to satisfactorily attain the effect of this invention.

The composition of the present invention generally contains the binder in an amount of from 10 to 50% by weight.

The radiation-sensitive agent (for example, a photo acid generator) for use in the present invention is one decomposed, when exposed to active rays or radiations, to give acids. Examples thereof include a photo-initiator for photo-cationic polymerization, a photo-initiator for photo-radical polymerization, a photolytically decoloring or discoloring agent for dyes, known compounds of generating acids when exposed to light such as those used in ordinary microresists, etc., and a mixture thereof. Any of these may be selected for use in the present invention.

As specific examples of the radiation-sensitive agents for use in the present invention, mentioned are diazonium salts such as those described in S. I. Schlesinger, Photogr. Sci. Eng., 18, 387 (1974), T. S. Baletal, Polymer, 21, 423 (1980), WO 91/15,807, etc.; ammonium salts such as those described in U.S. Pat. Nos. 4,069,055, 4,069,056, European Patent 412,457, etc.; phosphonium salts such as those described in D. C. Necker et al., Macromolecules, 17, 2468 (1984), C. S. Wenetal, Teh. Proc. Conf. Rad. Curing ASIA, p. 478, Tokyo, Oct. (1988), U.S. Pat. Nos. 4,069,055, 4,069,056, etc.; iodonium salts such as those described in J. V. Crivello et al., Macromolecules, 10 (6), 1307 (1977), Chem. & Eng. News, Nov. 28, p. 31 (1988), European Patent 104,143, JP-A 2-150848, 2-296514, etc.; photo acid generators having o-nitrobenzyl protective groups, such as those described in S. Hayase et al., J. Polymer Sci., 25, 753 (1987), E. Reichmanis et al., J. Polymer Sci., Polymer Chem. Ed., 23, 1 (1985), Q.Q Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I., 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 290,750, 046,083, 156, 535, 271,851, 388,343, U.S. Pat. Nos. 3,901,710, 4,181,531, JP-A 60-198538, 53-133022, etc.; compounds of generating carboxylic acids by photolysis, such as those described in U.S. Pat. No. 5,204,217, etc.; compounds of generating sulfonic acids, such as those described in M. Tunooka et al., Polymer Preprints, Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 199,672, 84,515, 44,115, 101,122, U.S. Pat. Nos. 4,618,564, 4,371,605, 4,431,774, JP-A 64-18143, 2-245756, 4-365048, 3-223864, 3-223865, 3-245756, 4-314055, 5-197149, JP-B 5-70814, European Patents 383,343, 537,879, 571,330, etc.; disulfone compounds such as those described in JP-A 61-166544, 2-71270, 5-210239, etc.; diazo compounds such as those described in JP-A 3-71139, 4-210960, 4-217249, JP-B 3-5739, 3-6495, U.S. Pat. Nos. 4,735,885, 5,171,656, 4,902,784, 4,808,512, 5,182,185, 5,039,596, 5,158,855, 5,256,517, European Patents 378,068, 417,556, 417,557, 552,548, 440,375, German Patent 4,014,649, J. Photographic Science, Vol. 19, 88 (1971), etc.

Also usable as the radiation-sensitive agents are polymer compounds, into which groups or compounds capable of photolytically generating acids have been introduced into their main chain, such as those described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A 63-26653, 55-164824, 62-69263, 63-146038, 63-163452, 62-153853, 63-146029, etc.

Also usable are known 1,2-naphthoquinonediazido-5-(and/or -4-)sulfonates of aromatic or aliphatic polyhydroxy compounds, such as those described in JP-B 3-42656, 3-2293, 56-2333, 62-3411, JP-A 58-150948, 60-154249, 60-134235, 62-10646, 62-153950, 60-146234, 62-178562, 63-113451, 64-76047, 1-147538, 1-189644, 1-309052, 2-19846, 2-84650, 2-72363, 2-103543, 2-285351, 2-296248, 2-296249, 3-48251, 3-48249, 3-119358, 3-144454, 3-185447, 4-1652, 4-60548, 5-158234, 5-224410, 5-303198, 5-297580, 5-323597, Japanese Patent Application Nos. 5-251781, 5-251780, 5-233537, U.S. Pat. Nos. 4,797,345, 4,957,846, 4,992,356, 5,151,340, 5,178,986, European Patents 530,148, 573,056, etc. Where the 1,2-naphthoquinonediazide compound is added singly, as the photo acid generator, to the positive photoresist of the present invention, it is preferred that the photoresist is one to be exposed to g-ray or i-ray.

Also usable are compounds capable of photolytically generating acids, such as those described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, European Patent 126, 712, etc. Also usable are low-molecular compounds or resins having both acid-decomposing groups and photo-acid-generating groups, such as those described in JP-A 64-35433, 2-18564, 4-199152, 4-355760, 5-181264, U.S. Pat. No. 5,130,392, European Patents 342,494, 342,495, Proc. ACS Div. Polymeric Mat. and Engrg., Vol. 61, p. 278 (1989), etc.

Among the above-mentioned compounds capable of being decomposed to generate acids, when exposed to active rays or radiations, especially effective ones are mentioned hereinunder.

(1) An oxazole derivative substituted by a trihalomethyl group, which is represented by the following formula (4); and a s-triazine derivative substituted by trihalomethyl groups, which is represented by the following formula (5):

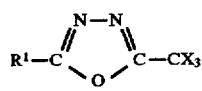

(PAG1)

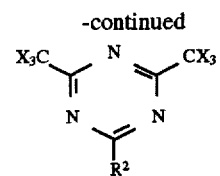

(PAG2)

In these formulae, $R^1$ represents a substituted or unsubstituted aryl or alkenyl group; $R^2$ represents a substituted or unsubstituted aryl, alkenyl or alkyl group, or $-CX_3$; X represents a chlorine atom or a bromine atom, and a plurality of X may be the same or different.

As specific examples of these derivatives, the following compounds are mentioned, which, however, are not limitative.

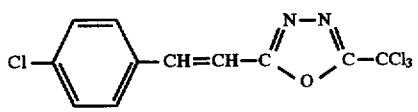

(PAG1-1)

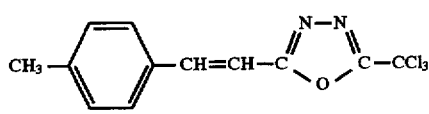

(PAG1-2)

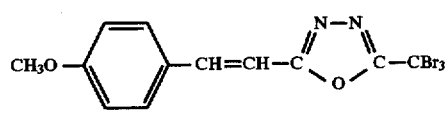

(PAG1-3)

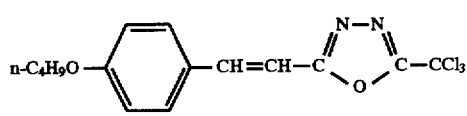

(PAG1-4)

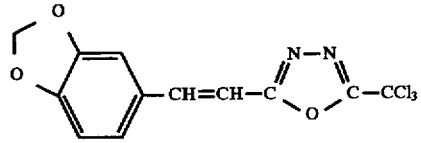

(PAG1-5)

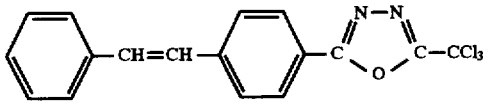

(PAG1-6)

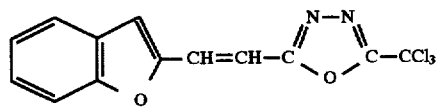

(PAG1-7)

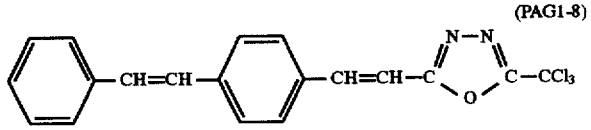

(PAG1-8)

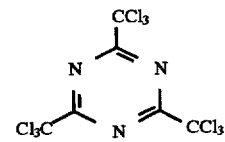

(PAG2-1)

-continued

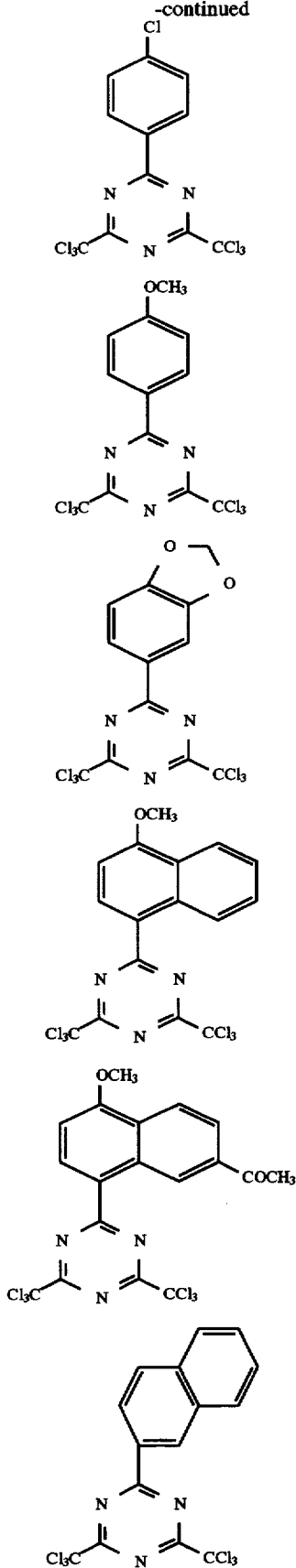

(PAG2-2)
(PAG2-3)
(PAG2-4)
(PAG2-5)
(PAG2-6)
(PAG2-7)

-continued

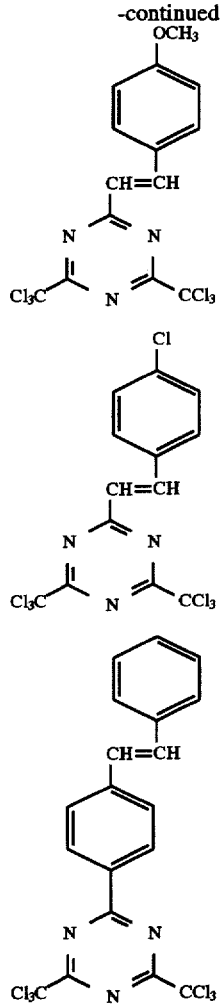

(PAG2-8)
(PAG2-9)
(PAG2-10)

(2) Iodonium salts of the following formula (6), and sulfonium salts of the following formula (7):

(PAG3)

(PAG4)

In these formulae, $Ar^1$ and $Ar^2$ each independently represent a substituted or unsubstituted aryl group. As preferred substituents for the group, mentioned are an alkyl group (preferably having 1 to 6 carbon atoms), a haloalkyl group (preferably having 1 to 6 carbon atoms), a cycloalkyl group, an aryl group, an alkoxy group (preferably having 1 to 6 carbon atoms), a nitro group, a carboxyl group, an alkoxycarbonyl group, a hydroxyl group, a mercapto group and a halogen atom.

$R^3$, $R^4$ and $R^5$ each independently represent a substituted or unsubstituted alkyl or aryl group. Preferred are an aryl group having from 6 to 14 carbon atoms, an alkyl group having from 1 to 8 carbon atoms, and their substituted derivatives. As preferred substituents, mentioned are an alkoxy group having from 1 to 8 carbon atoms, an alkyl group having from 1 to 8 carbon atoms, a nitro group, a carboxyl group, a hydroxyl group and a halogen atom, for the aryl group; while an alkoxy group having from 1 to 8 carbon atoms, a carboxyl group and an alkoxycarbonyl group having from 2 to 9 carbon atoms, for the alkyl group.

$Z^-$ represents a pair anion, including, for example, $BF_4^-$, $AsF_6^-$, $PF_6^-$, $SbF_6^-$, $SiF_6^{2-}$, $ClO_4^-$; perfluoroalkanesulfonato anions such as $CF_3SO_3^-$, etc.; pentafluorobenzenesulfonato anion; condensed poly-cyclic aromatic sulfonato anions such as naphthalene-1-sulfonato anions, etc.; anthraquinonesulfonato anions, sulfonato group-containing dyes, etc. However, these are not limitative.

Two of $R^3$, $R^4$ and $R^5$, as well as $Ar^1$ and $Ar^2$ may be bonded to each other either directly or via a linking group.

As specific examples of these salts, mentioned are the following compounds, which, however, are not limitative.

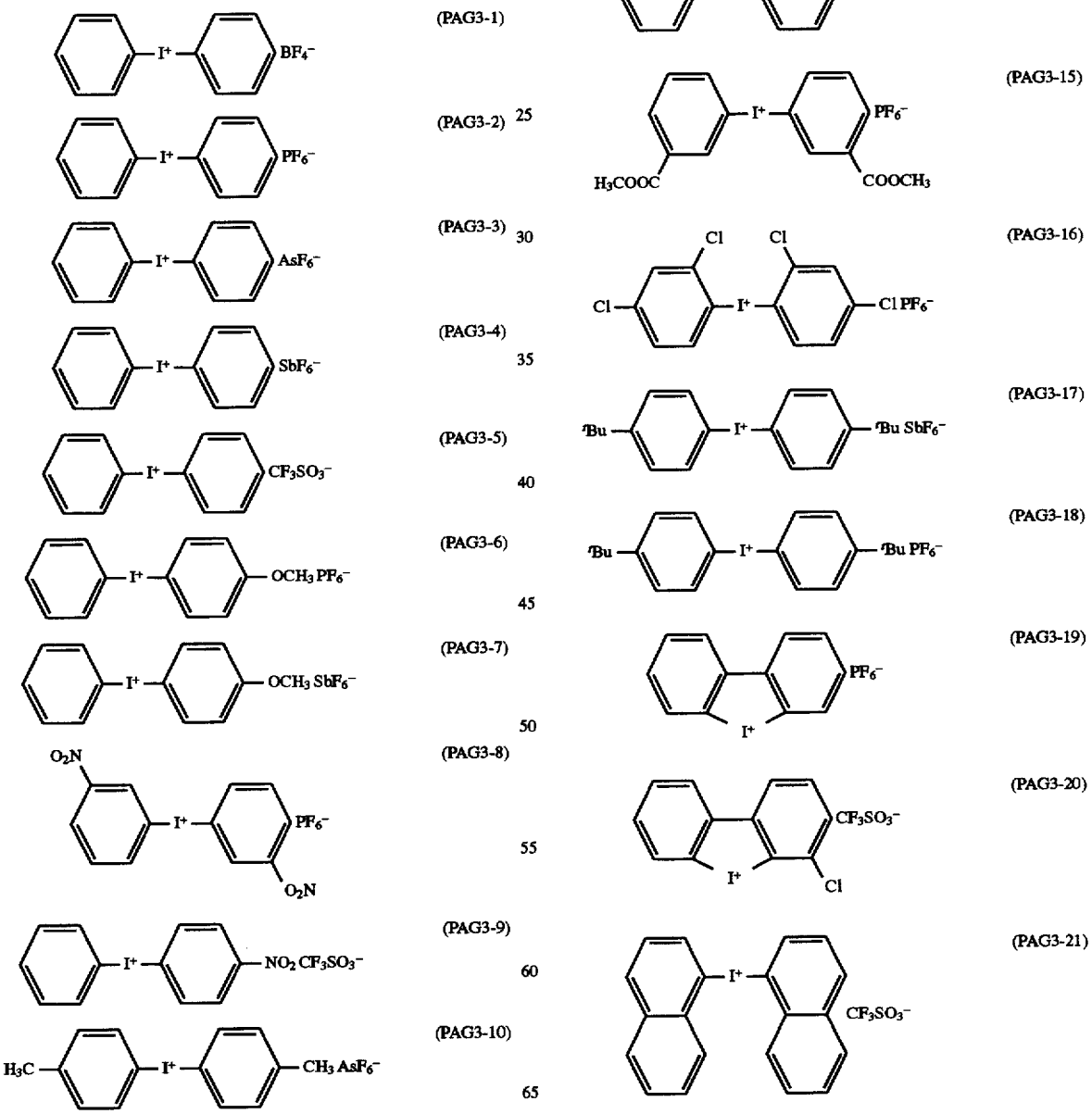

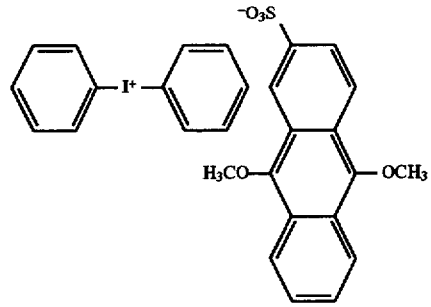 (PAG3-22)
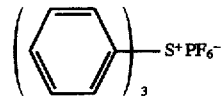 (PAG4-2)
(PAG3-23)
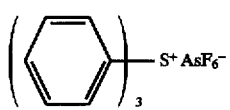 (PAG4-3)
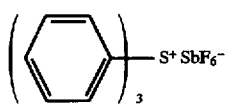 (PAG4-4)
(PAG3-24)
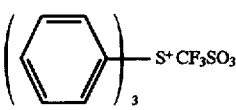 (PAG4-5)
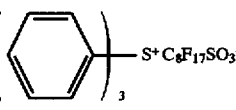 (PAG4-6)
(PAG3-25)
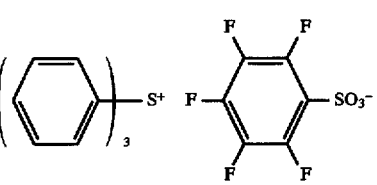 (PAG4-7)
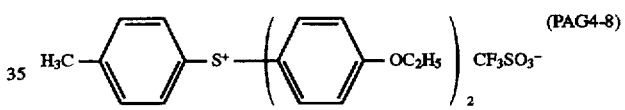 (PAG4-8)
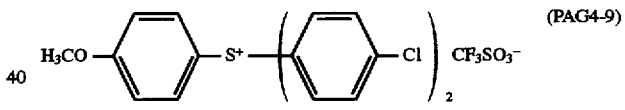 (PAG4-9)
(PAG3-26)
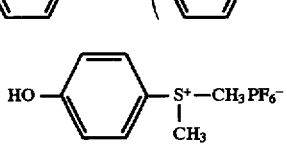 (PAG4-10)
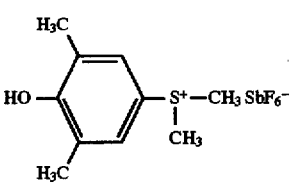 (PAG4-11)
(PAG3-27)
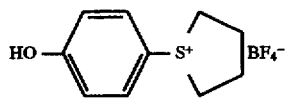 (PAG4-12)
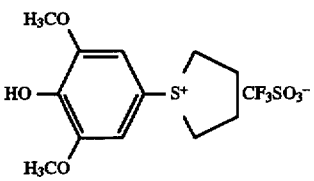 (PAG4-13)
(PAG4-1)

-continued (PAG4-14)

(PAG4-15)

(PAG4-16)

(PAG4-17)

(PAG4-18)

(PAG4-19)

(PAG4-20)

(PAG4-21)

(PAG4-22)

(PAG4-23)

(PAG4-24)

(PAG4-25)

(PAG4-26)

(PAG4-27)

(PAG4-28)

(PAG4-29)

(PAG4-30)

(PAG4-31)

(PAG4-32)

(PAG4-33)

-continued

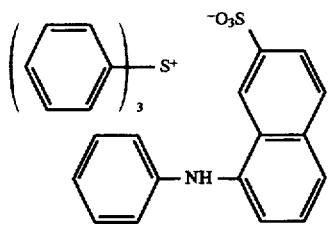
(PAG4-34)

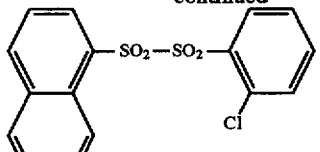

The above-mentioned onium salts of formulae (6) and (7) are known, and these can be produced, for example, according to the methods described in J. W. Knapczyk et al., J. Am. Chem. Soc., 91, 145 (1969), A. L. Maycok et al., J. Org. Chem., 35, 2532 (1970), E. Goethas et al., Bull. Soc. Chem. Belg., 73, 546 (1964), H. M. Leicester, J. Ame. Chem. Soc., 51, 3587 (1929), J. V. Crivello et al., J. Polym. Chem. Ed., 18, 2677 (1980), U.S. Pat. Nos. 2,807,648, 4,247,473, JP-A 53-101331, etc.

(3) Disulfone derivatives of the following formula (8) and iminosulfonate derivatives of the following formula (9):

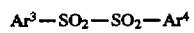
(PAG5)

(8)

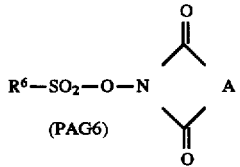
(PAG6)

(9)

In these formulae, $Ar^3$ and $Ar^4$ each independently represent a substituted or unsubstituted aryl group; $R^6$ represents a substituted or unsubstituted alkyl or aryl group; A represents a substituted or unsubstituted alkylene, alkenylene or arylene group.

As specific examples of these derivatives, mentioned are the following compounds, which, however, are not limitative.

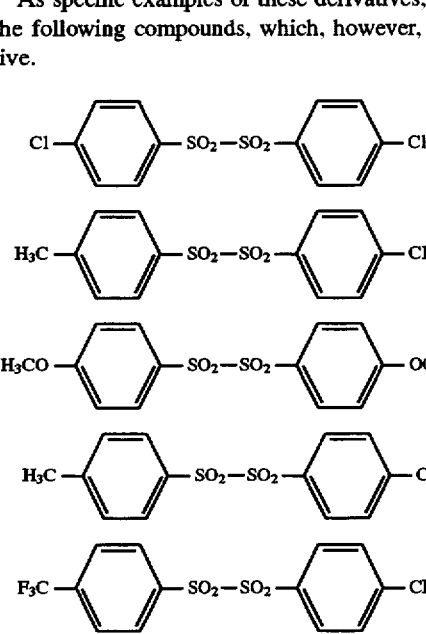

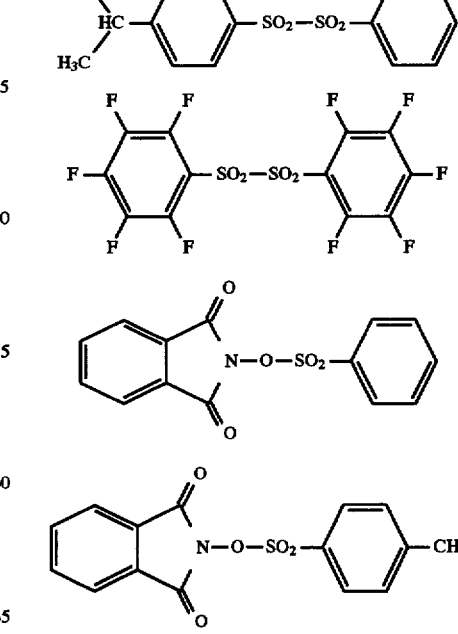

-continued

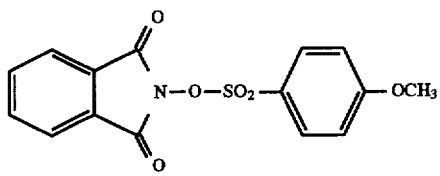 (PAG6-3)

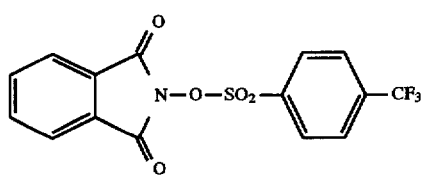 (PAG6-4)

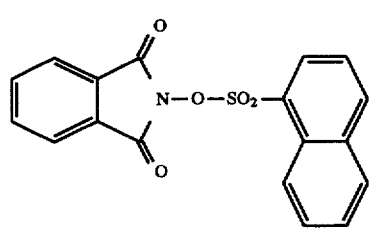 (PAG6-5)

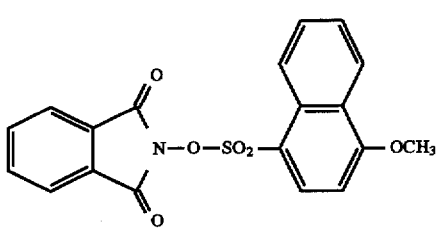 (PAG6-6)

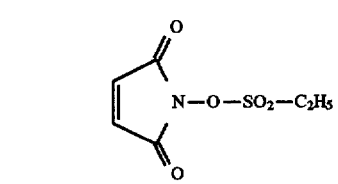 (PAG6-7)

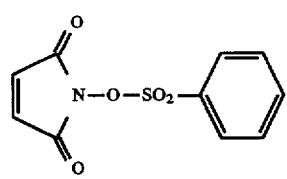 (PAG6-8)

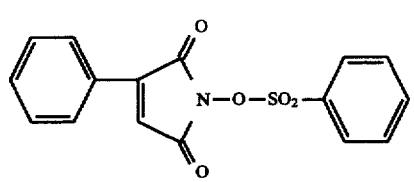 (PAG6-9)

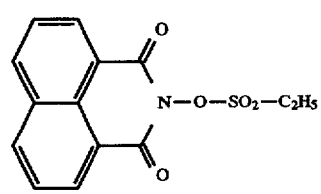 (PAG6-10)

-continued

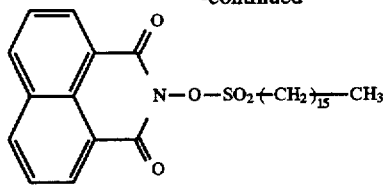 (PAG6-11)

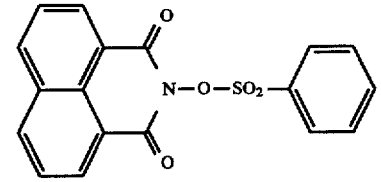 (PAG6-12)

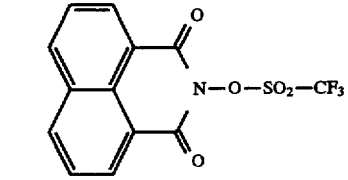 (PAG6-13)

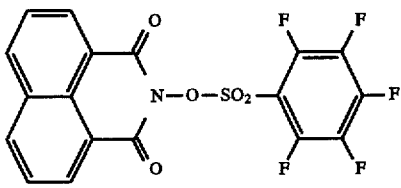 (PAG6-14)

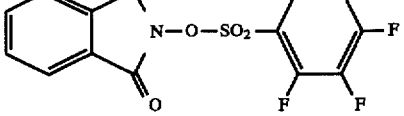 (PAG6-15)

(4) Diazo compounds of the following formula (10):

$$R^7-Y-\underset{\underset{N_2}{\parallel}}{C}-Y-R^7 \quad (PAG7) \quad (10)$$

wherein Y represents —CO— or —SO$_2$—; R$^7$ represents a linear, branched or cyclic alkyl group having from 1 to 12 carbon atoms, or a substituted or unsubstituted aryl or aralkyl group.

As specific examples, mentioned are the following compounds, which, however, are not limitative.

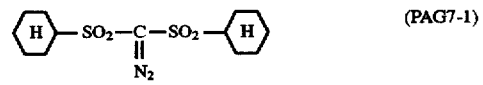 (PAG7-1)

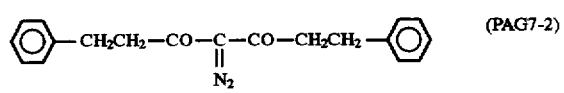 (PAG7-2)

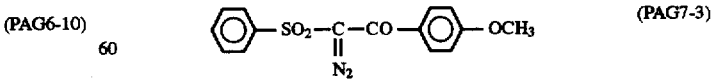 (PAG7-3)

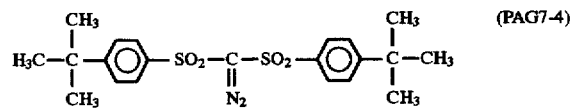 (PAG7-4)

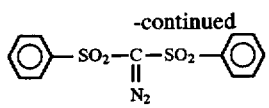 (PAG7-5)

The amount of the compound capable of being decomposed, when exposed to active rays or radiations, to generate acids, may be generally from 0.1 to 100 parts by weight, preferably from 0.5 to 50 parts by weight, more preferably from 1.0 to 20 parts by weight, based on 100 parts of the binder in the composition. If the amount of said photo acid generator is less than 0.1 part by weight, the pattern formation is unsatisfactory. However, if it is more than 100 parts by weight, the resist of the resin composition gives scum when formed into patterns. These photo acid generators can be used singly or as their mixtures.

The composition of the present invention may optionally contain, if desired, various additives such as dissolution inhibitor, dissolution accelerator, acid crosslinking agent, light absorbent, surfactant, adhesion aid, stabilizer for storage, photosensitizer, etc.

As the dissolution inhibitor, for example, usable are acid-decomposing low-molecular compounds such as those described in JP-B 48-89003, 60-20738, 62-39421, 63-20325, 5-88833, JP-A 55-12995, 62-27829, 62-215946, 62-244038, 63-10153, 64-57258, 1-106038, 1-106040, 1-106041, 2-51509, 2-248953, 2-177031, 3-107163, 3-198059, 4-355761, 4-37760, 5-19479, 5-39282, 5-127370, 5-142774, 5-194472, 5-216235, 5-249681, 5-341531, 6-51519, Japanese Patent Application Nos. 4-305929, 5-51222, U.S. Pat. Nos. 4,250,247, 5,015,554, 5,081,001, 5,200,529, 5,204,216, 5,210,003, European Patents 249,139, 475,903, 520,654, 535,653, 541,112, 558,272, German Patents 4,005,212, 4,143,081, 4,207,263, Proc. SPIE, 920, 33 (1988), Proc. SPIE, 920, 60 (1988), Proc. SPIE, 1672, 33 (1992), Proc. SPIE, 1672, 500 (1992), etc.; as well as resins having groups capable of being decomposed by acids in the molecule, for example, resins having groups capable of being decomposed by acids in either the main chain or the side chains or in both the main chain and the side chains, such as those described in JP-A 62-229242, 63-36240, 2-18564, 2-19847, 2-25850, 3-189652, 4-211258, 4-251259, 5-66563, 5-94018, 5-224422, 5-249682, 5-265212, JP-B 2-27660, 5-19139, 5-39470, U.S. Pat. Nos. 4,912,018, 4,931,379, 4,962,171, 5,120,633, 5,258,257, European Patents 472,290, 553,737, etc.

Of such acid-decomposing low-molecular compounds, preferred are those having, in one molecule, three or more structural units each having, in one benzene ring, one group capable of being decomposed by acids, in which the adjacent acid-decomposing groups are separated from each other, at the remotest site, via at least 9 bonding atoms, preferably at least 10 bonding atoms, more preferably at least 11 bonding atoms, excluding the atoms constituting the acid-decomposing groups. The uppermost limit of the bonding atoms is preferably 50, more preferably 30.

The acid-decomposing dissolution-inhibiting compounds having, in one molecule, three or more, preferably four or more structural units each having, in one benzene ring, one acid-decomposing group, in which the adjacent acid-decomposing groups are separated from each other via a certain distance or more, have extremely improved ability to retard the solubility of the alkali-soluble resins in the composition of the present invention.

The distance between the adjacent acid-decomposing groups in these compounds is represented by the number of the bonding atoms, excluding the acid-decomposing groups themselves, existing between the groups. For example, in the following compounds (1°) and (2°), the adjacent acid-decomposing groups are separated from each other via 4 bonding atoms; and in the following compound (3°), the adjacent acid-decomposing groups are separated from each other via 12 bonding atoms.

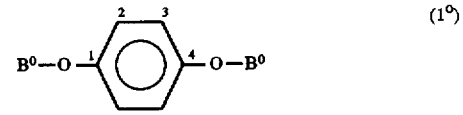 (1°)

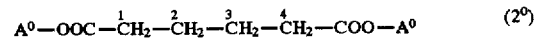 (2°)

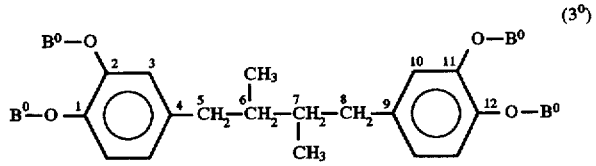 (3°)

In these compounds, —COO—A° and —O—B° are acid-decomposing groups.

The acid-decomposing dissolution-inhibiting compounds generally has a molecular weight of 3,000 or less, preferably from 500 to 3,000, more preferably from 1,000 to 2,500.

As the groups capable of being decomposed by acids to be in these compounds, mentioned are —COO—A° and —O—B°. More preferably mentioned are —R°—COO—A° and —AR—O—B°. In these, A° represents —C(R$^{O1}$)(R$^{O2}$)(R$^{O3}$), —Si(R$^{O1}$)(R$^{O2}$)(R$^{O3}$) or —C(R$^{O4}$)(R$^{O5}$)—O—R$^{O6}$; and B° represents A° or —CO—O—A°.

R$^{O1}$, R$^{O2}$, R$^{O3}$, R$^{O4}$ and R$^{O5}$ may be the same or different and each represents a hydrogen atom, an alkyl group, a cycloalkyl group, an alkenyl group or an aryl group; R$^{O6}$ represents an alkyl group or an aryl group; provided that at least two of R$^{O1}$ to R$^{O3}$ must be others than hydrogen atom and that two of R$^{O1}$ to R$^{O3}$ and two of R$^{O4}$ to R$^{O6}$ may be bonded to each other to form rings. R° represents an optionally substituted divalent or more poly-valent aliphatic or aromatic hydrocarbon group; —AR— represents an optionally substituted, mono-cyclic or poly-cyclic, divalent or more poly-valent aromatic group.

The alkyl group mentioned above is preferably an alkyl group having from 1 to 4 carbon atoms, such as a methyl group, an ethyl group, a propyl group, an n-butyl group, a sec-butyl group, a t-butyl group, etc.; the cycloalkyl group mentioned above is preferably a cycloalkyl group having from 3 to 10 carbon atoms, such as a cyclopropyl group, a cyclobutyl group, a cyclohexyl group, an adamantyl group, etc.; the alkenyl group mentioned above is preferably an alkenyl group having from 2 to 4 carbon atoms, such as a vinyl group, a propenyl group, an allyl group, a butenyl group, etc.; the aryl group mentioned above is preferably an aryl group having from 6 to 14 carbon atoms, such as a phenyl group, a xylyl group, a toluyl group, a cumenyl group, a naphthyl group, an anthracenyl group, etc.

As examples of the substituents for these groups, mentioned are a hydroxyl group, a halogen atom (e.g., fluorine, chlorine, bromine, iodine), a nitro group, a cyano group, the above-mentioned alkyl group, an alkoxy group (e.g., methoxy, ethoxy, hydroxyethoxy, propoxy, hydroxypropoxy, n-butoxy, isobutoxy, sec-butoxy, t-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cyanamyl, valeryl), an acyloxy group (e.g., butyryloxy), the above-mentioned alkenyl group, an alkenyloxy group (e.g., vinyloxy, propenyloxy, allyloxy, butenyloxy), the above-mentioned aryl group, an aryloxy group (e.g., phenoxy), and an aryloxycarbonyl group (e.g., benzoyloxy).

Preferred are silyl ether groups, cumyl ester groups, acetal groups, tetrahydropyranyl ether groups, enol ether groups, enol ester groups, tertiary alkyl ether groups, tertiary alkyl ester groups, and tertiary alkylcarbonato groups. More preferred are tertiary alkyl ester groups, tertiary alkylcarbonato groups, cumyl ester groups, and tetrahydropyranyl ether groups.

As preferred examples of these compounds, mentioned are polyhydroxy compounds having only one hydroxyl group in one benzene ring and having three or more hydroxyl groups in one molecule, in which the phenolic OH groups have been partly or wholly protected by the above-mentioned group, —R$^0$—COO—A$^0$ or B$^0$, such as those described in JP-A 1-289946, 2-2560, 3-128959, 3-158855, 3-179353, 3-191351, 3-200251, 3-200252, 3-200253, 3-200254, 3-200255, 3-259149, 3-279958, 4-1650, 4-1651, 4-11260, 4-12356, 4-12357, 4-271349, 5-158233, 5-224409, 5-257275, 5-297581, 5-297583, 5-303199, 5-303200, 5-341510, 3-191351, 4-50851, 5-265211, 5-323597, Japanese Patent Application Nos. 5-251781, 5-251780, 5-233537, 5-85856, European Patents 530,148, 528,401, 555,861, 570,884, 573,056, etc.

More concretely, mentioned are the following compounds (1) to (46), which, however, are not limitative.

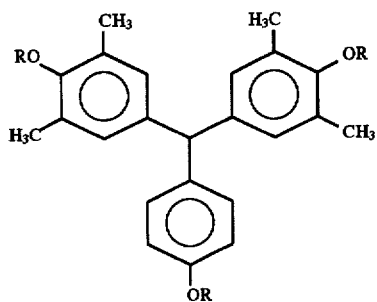
(1)

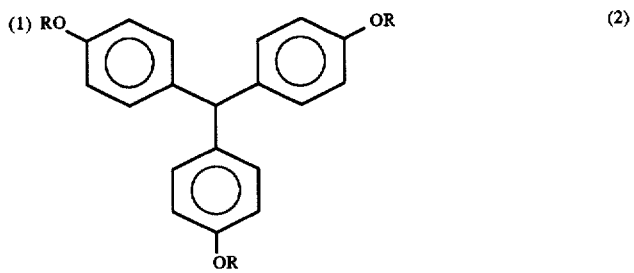
(2)

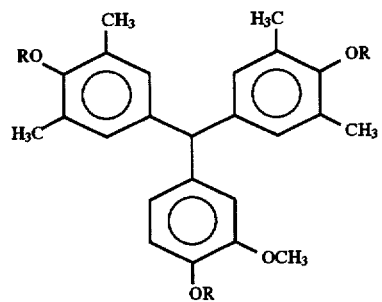
(3)

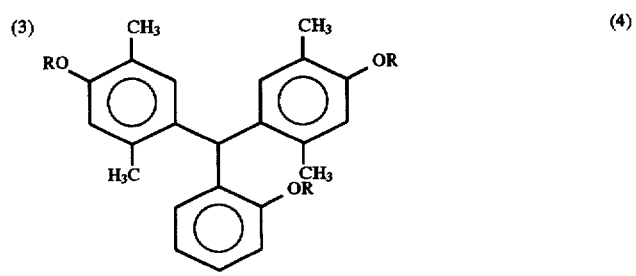
(4)

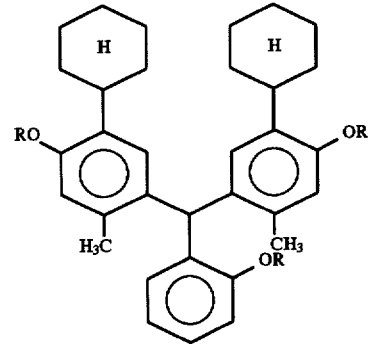
(5)

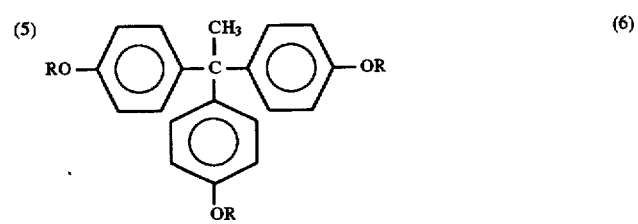
(6)

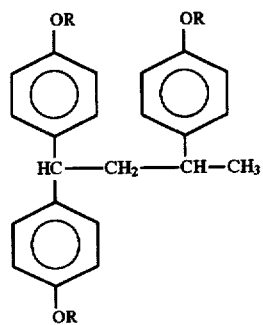
(7)

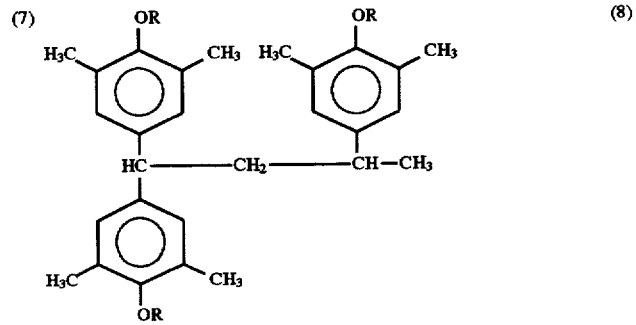
(8)

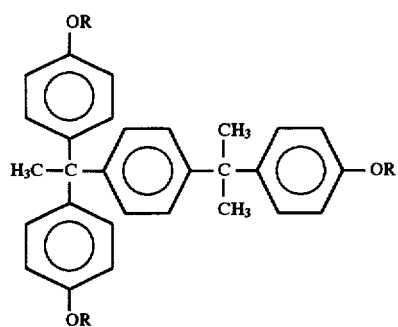
(9)
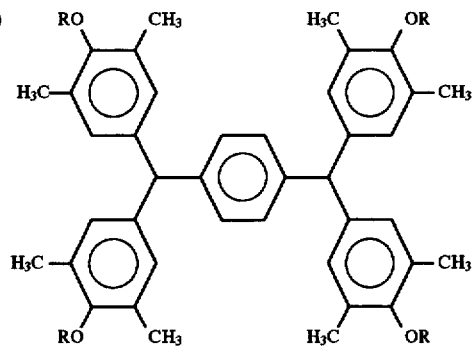
(10)
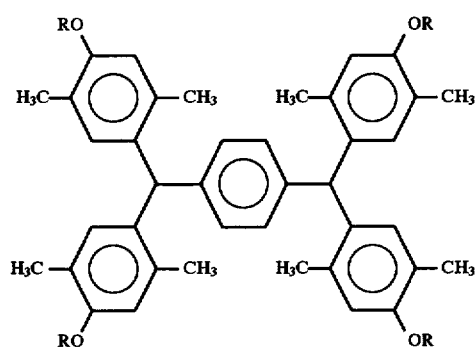
(11)
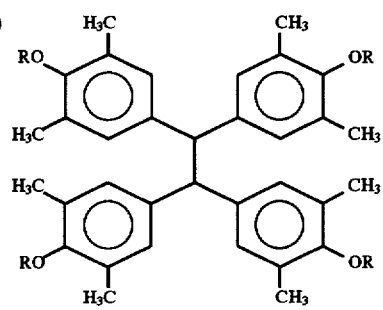
(12)
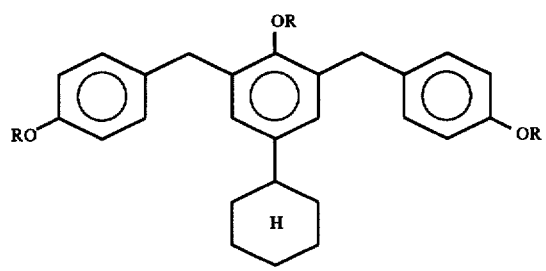
(13)
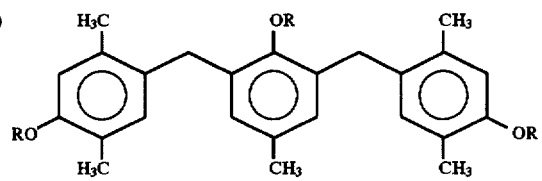
(14)
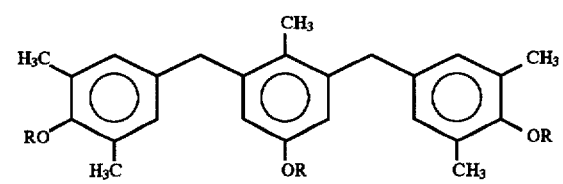
(15)
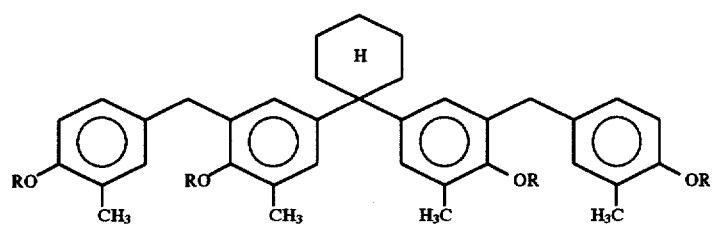
(16)
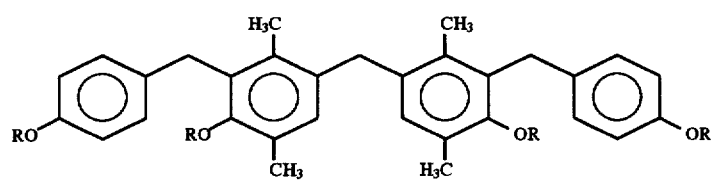
(17)

-continued
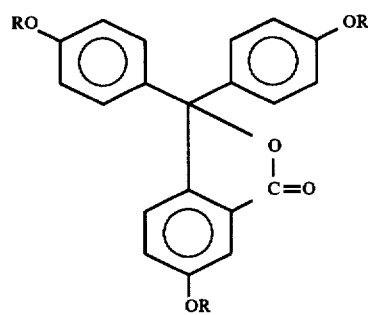 (18)
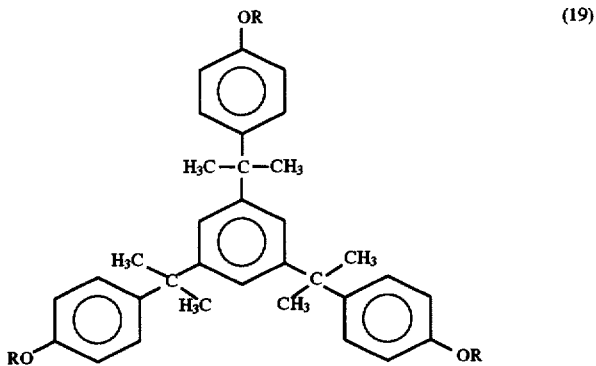 (19)
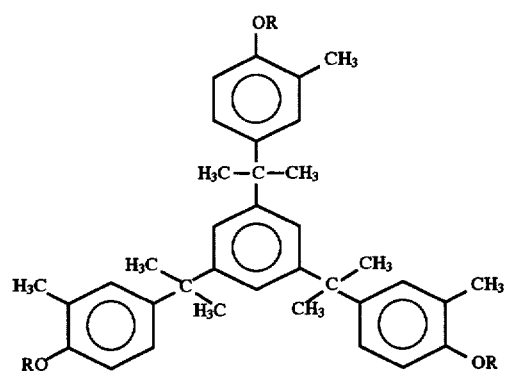 (20)
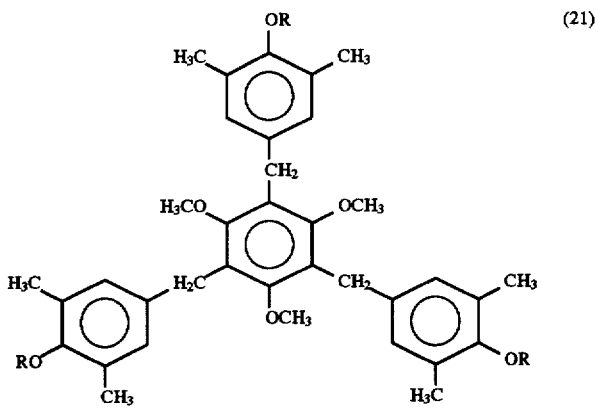 (21)
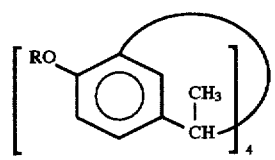 (22)
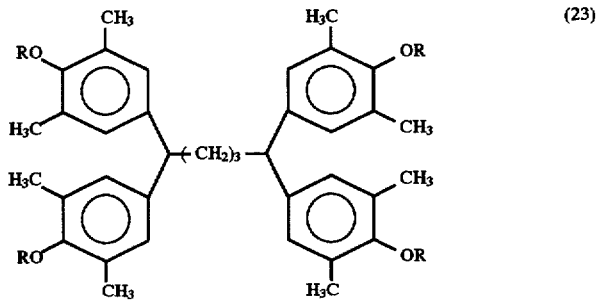 (23)
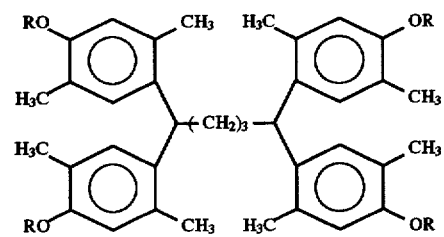 (24)
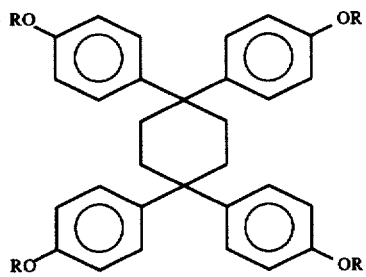 (25)

-continued
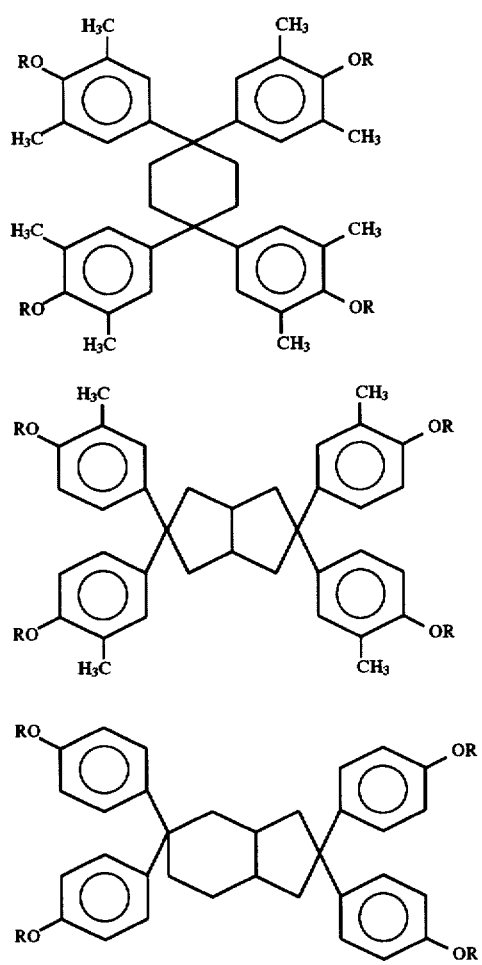
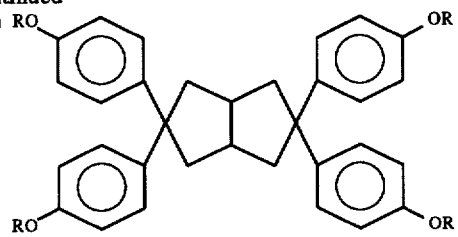
(26) (27)
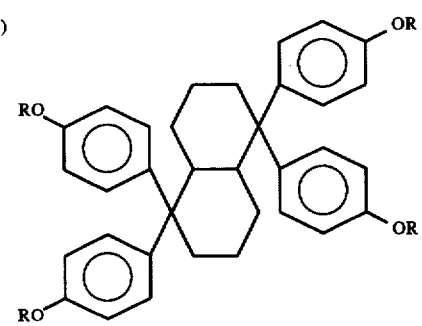
(28) (29)
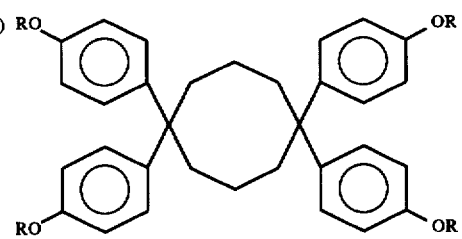
(30) (31)
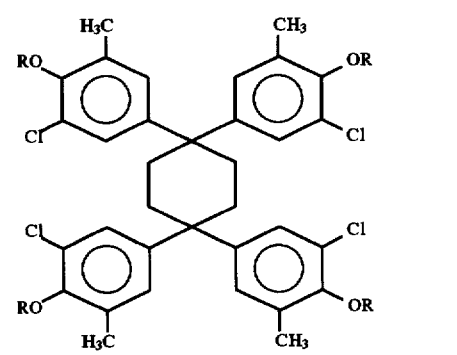
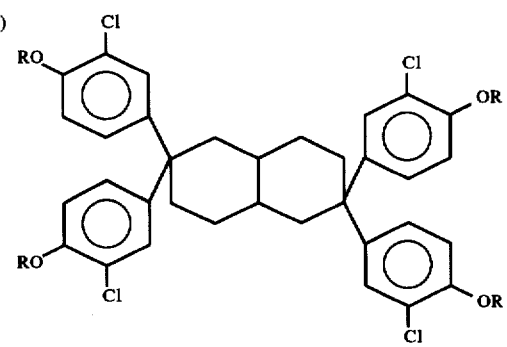
(32) (33)
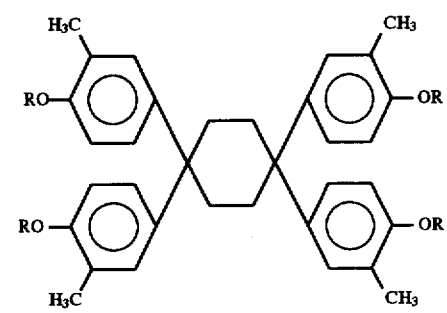
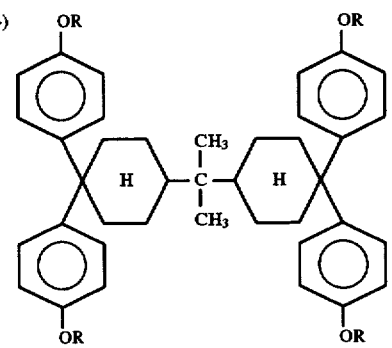
(34) (35)

-continued
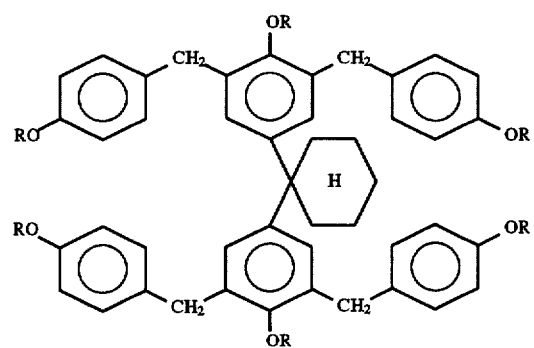
(36)
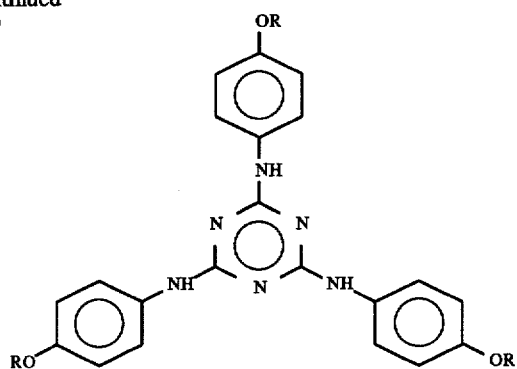
(37)
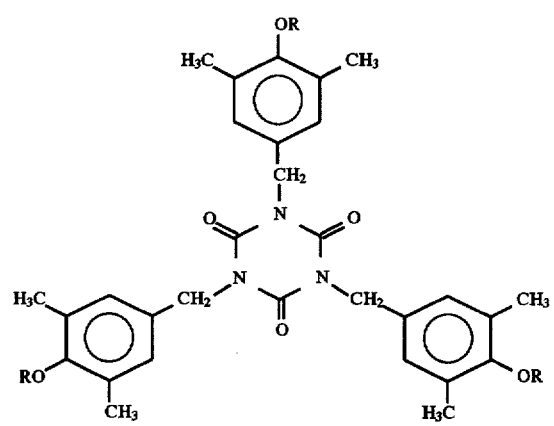
(38)
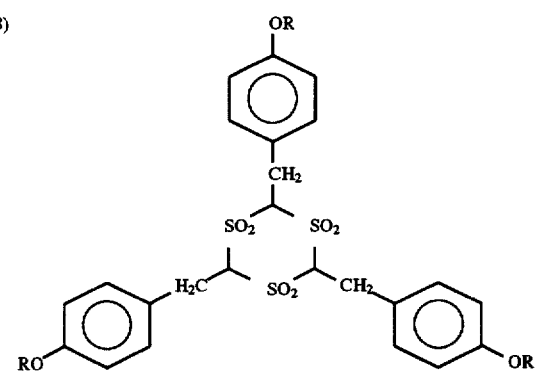
(39)
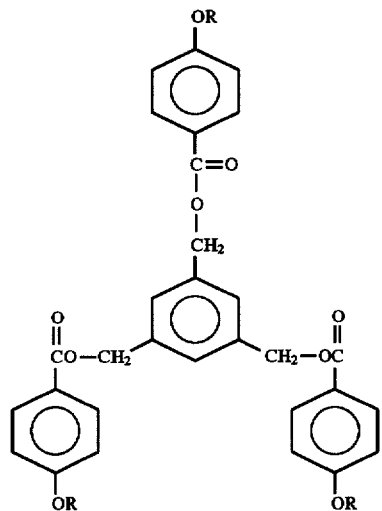
(40)
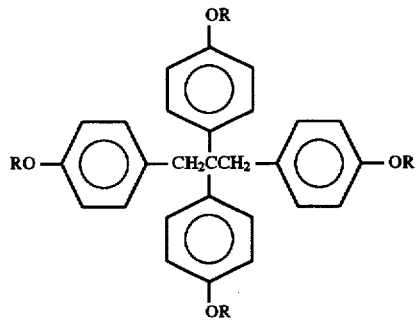
(41)
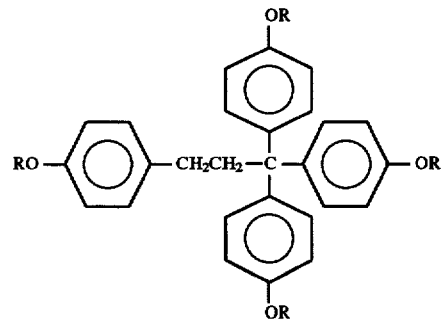
(42)
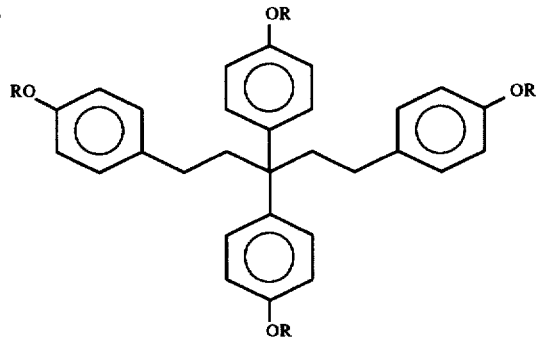
(43)

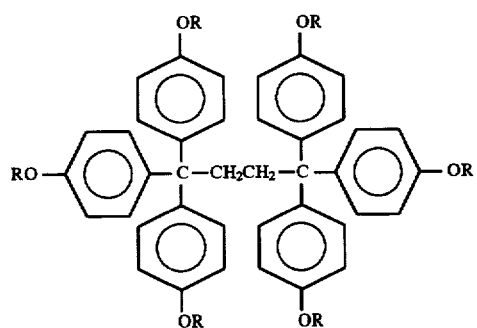

(44)

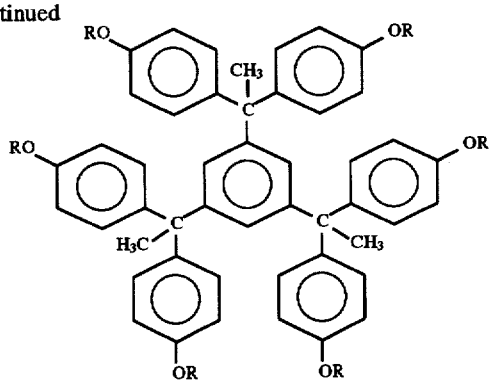

(45)

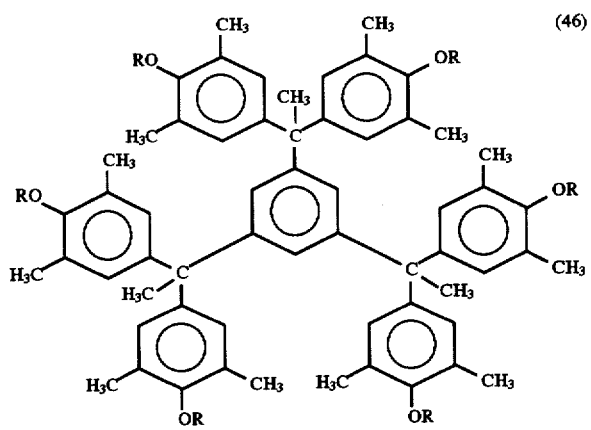

(46)

In compounds (1) to (46), R represents a hydrogen atom, $-CH_2-COO-C(CH_3)_2C_6H_5$, $-CH_2-COO-t-C_4H_9$, $-COO-t-C_4H_9$, or

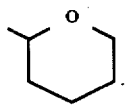

At least three R's in one molecule must be others than a hydrogen atom, and plural R's, if any, in one molecule need not be the same.

In the resins having groups capable of being decomposed by acids, the groups capable of being decomposed by acids may be the same as those in the above-mentioned acid-decomposing low-molecular compounds. Where the resins have such acid-decomposing groups bonded to the side chains, their resin skeletons are preferably alkali-soluble resins having, at the side chains, —OH or —COOH, preferably —$R^0$—COOH or —AR—OH. Such alkali-soluble resins include, for example, polyhydroxystyrenes, hydrogenated polyhydroxystyrenes, novolak resins, hydrogenated novolak resins, acetone-pyrogallol resins, halogeno- or alkyl-substituted polyhydroxystyrenes, hydroxystyrene-N-substituted maleimide copolymers, partially O-acylated polyhydroxystyrenes, styrene-maleic anhydride copolymers, carboxyl-containing methacrylic resins and their derivatives.

Especially preferred examples of resins having groups capable of being decomposed by acids are mentioned below, by means of general formulae, which, however, are not limitative.

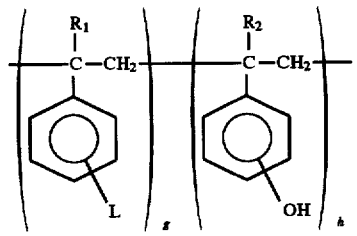

(11)

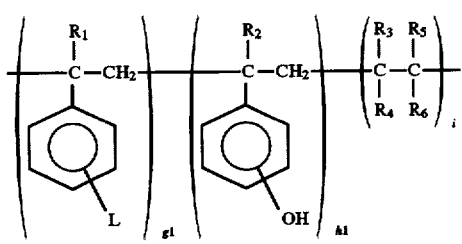

(12)

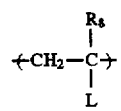

(13)

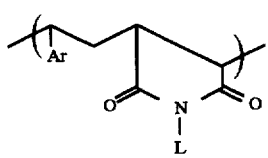

(14)

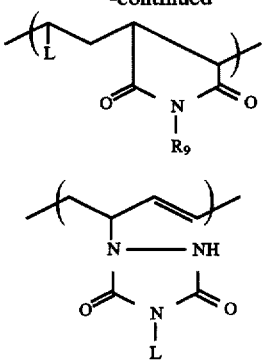 (15)

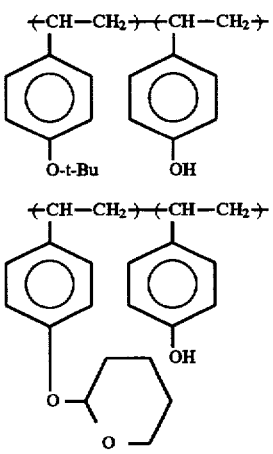 (16)

In these formulae;

L represents —COOA°, —O—B°, —(O)n—R°—COO—A°, —AR—O—B° (where AR, A° and B° have the same meanings as those mentioned above);

$R_1$, $R_2$, $R_3$ and $R_5$ may be the same or different and each represents a hydrogen atom, or an alkyl group having from 1 to 4 carbon atoms;

$R_4$ represents a hydrogen atom, a carboxyl group, a cyano group, or a substituted aryl group;

$R_6$ represents a hydrogen atom, a cyano group or —$COOR_7$;

$R_7$ represents a linear, branched or cyclic alkyl group having from 1 to 10 carbon atoms;

$R_8$ and $R_9$ each represent a hydrogen atom, or an alkyl group having from 1 to 4 carbon atoms;

Ar represents an optionally substituted, mono-cyclic or poly-cyclic, monovalent aromatic group;

$0<g\leq1$; $0\leq h<1$; $0<g1\leq1$; $0\leq h1<1$; $0\leq i<1$; $g+h=1$; $g1+h1+i=100$.

More concretely are mentioned the following compounds (47) to (69), which, however, are not limitative.

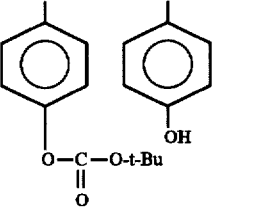 (47)

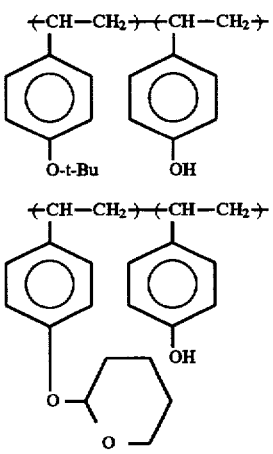 (48)

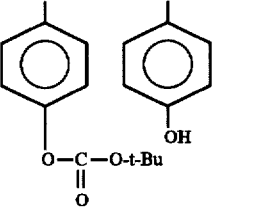 (49)

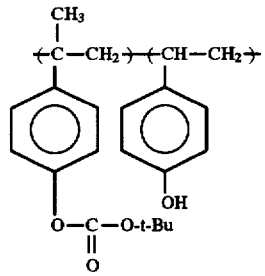 (50)

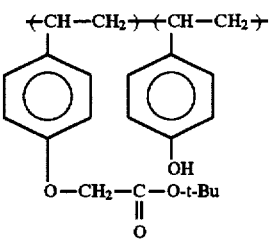 (51)

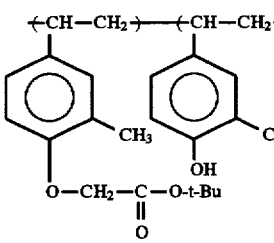 (52)

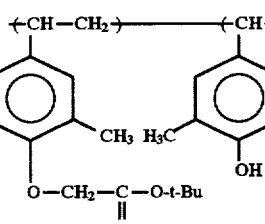 (53)

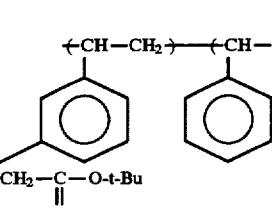 (54)

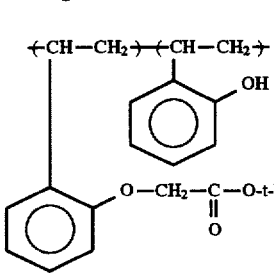 (55)

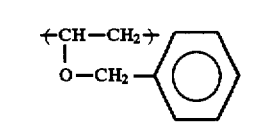 (56)

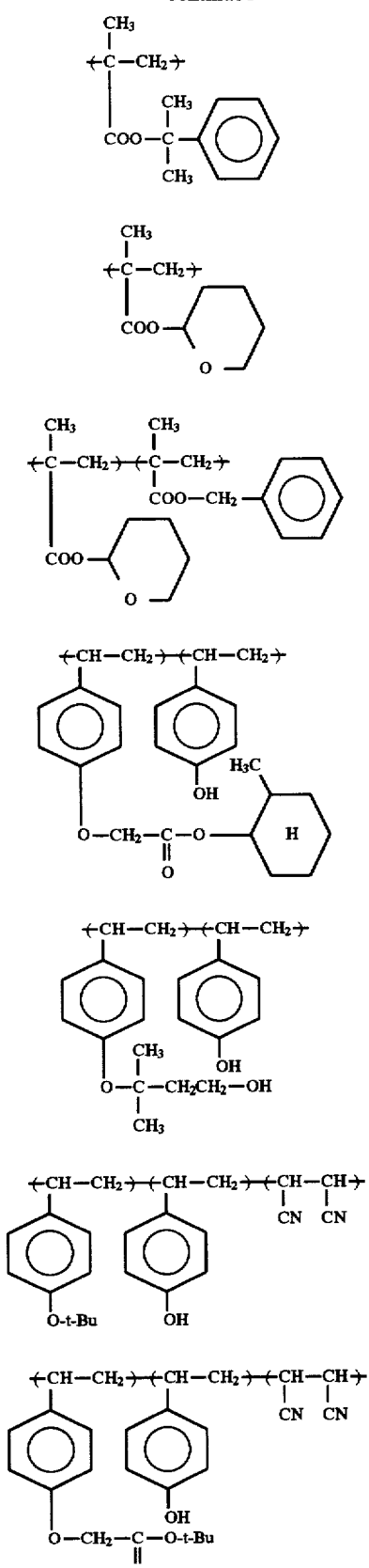
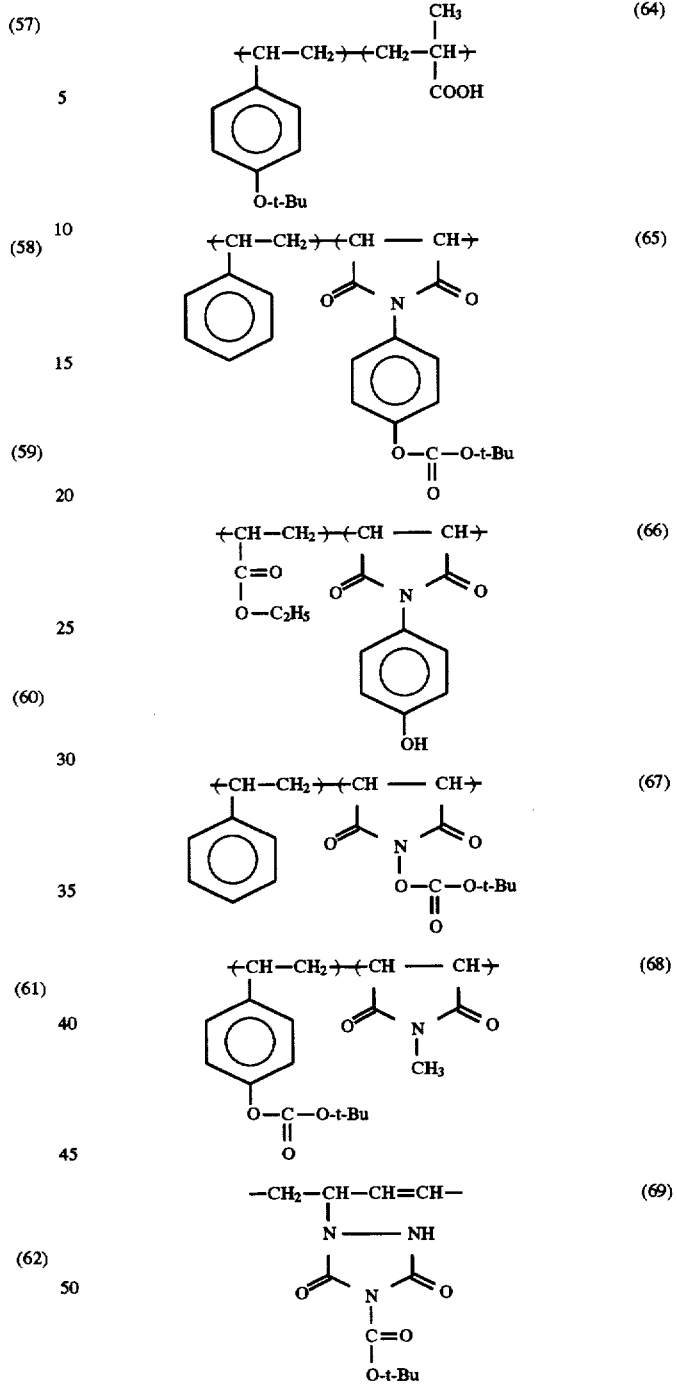

The above-mentioned resins having groups capable of being decomposed by acids can be obtained by reacting alkali-soluble resins and precursors of acid-decomposing groups, or by copolymerizing alkali-soluble resin monomers having acid-decomposing groups bonded thereto and various monomers, according to known methods such as those described in Can. J. Chem., Vol. 63, p. 15 (1985), European Patents 254,853, 488,748, 494,792, 498,630, 517,428, JP-A 2-25850, 3-223860, 4-251259, 4-350657, 4-350658, 4-195138, 5-112606, etc.

The content of the acid-decomposing groups in the resins is represented by B/(B+S), in which B represents the number of the acid-decomposing groups in the resin and S represents the number of alkali-soluble groups not protected by acid-decomposing groups in the resin. Said content is from 0.01 to 0.5, preferably from 0.01 to 0.30, more preferably from 0.01 to 0.15. If B/(B+S)>0.5, the resist film containing the resin is shrunk after PEB (post-exposure baking), or the resist film is adhered insufficiently to the substrate, or the resist film gives scum after development. For these reasons, such is unfavorable. On the other hand, if B/(B+S)<0.01, significant standing waves often remain on the side walls of the resist patterns formed. Therefore, such is unfavorable.

It is preferred that the resins having acid-decomposing groups have a weight average molecular weight (Mw) of from 1,000 to 100,000. If Mw is less than 1,000, the thickness of the resist film containing the resin is significantly reduced in the non-exposed areas, after development. If, on the other hand, Mw is more than 100,000, the solubility of the alkali-soluble resin itself in alkalis is low so that the sensitivity of the resist composition containing the resin is lowered. Especially preferably, Mw falls within the range from 2,000 to 50,000.

The weight average molecular weight of the resins as referred to herein is defined in terms of the molecular weight of polystyrene measured by gel permeation chromatography.

In the resin composition of the present invention, the content of the compounds having groups capable of being decomposed by acids (the above-mentioned low molecular compounds and resins) is preferably from 1 to 100 parts by weight, more preferably from 3 to 50 parts by weight, per 100 parts by weight of the polymers of formula (1) in the composition. If the proportion of the compounds capable of being decomposed by acids in the resin composition is more than 100 parts by weight, the sensitivity of the resist of the composition is lowered. If, however, it is less than one part by weight, the difference in the dissolving speed between the exposed area and the non-exposed area of the resist is too small and therefore, the resolution of the resist is lowered.

The above-mentioned acid-decomposing low molecular compounds can be combined with the above-mentioned acid-decomposing resins.

Dissolution accelerators may be added to the radiation-sensitive resin composition of the present invention essentially for the purpose of accelerating the alkali-solubility of the polymers of formula (1) in the composition. These includes, for example, phenol compounds having from about 2 to 6 benzene rings, such as bisphenol A, tris(4-hydroxyphenyl)methane, 1,1-bis(4-hydroxyphenyl)cyclohexane, 2,3,4-trihydroxybenzophenone, 2,3,4,4'-tetrahydroxybenzophenone, 2,3,4,3',4',5'-hexahydroxybenzophenone, α,α',α"-tris(4-hydroxyphenyl)-1,3,5-triisopropylbenzene, α,α',α"-tris(4-hydroxyphenyl)-1-ethyl-4-isopropylbenzene, 4,4'-(1-α-methylbenzylidene)bisphenol, 4,4'-[(2-hydroxyphenyl)methylene]-bis[2-cyclohexyl-5-methylphenol], 4,4'-cyclopentylidene-bisphenol, 4,4'-cyclohexylidene-bis[2-cyclohexylphenol], 4,4',4"-ethylidene-trisphenol, 2,6-bis[(2-hydroxy-5-methylphenyl)methyl]-4-methylphenol, 4,4',4",4"'-(1,4-phenylidenedimethylidene)tetrakis-phenol, etc.; 5-methylbenzotriazole, 1,2-naphthotriazole, indazole, imidazole, 4-azabenzimidazole, azauracil, quinazoline, azacyclononan-2-one, indole, 6,7-dihydro-5H-pyrotetrazole, as described in JP-B 48-12242; o-benzoic acid sulfimide, 5,5-diphenylthiohydantoin, hydantoin, 5-methylthiazoline-2-thione, as described in JP-B 56-19619; picolinic acid, nicotinic acid, coumaric acid, coumarinic acid, picric acid, as described in JP-A 52-40125; water-soluble polyhydric alcohols, e.g. ethylene glycol, diethylene glycol, triethylene glycol, 1,2-propanediol, 1,2-butanediol, 1,3-pentanediol, as described in JP-A 57-201229; 2H-pyrido[3,2-b]-1,4-oxazin-3[4H]-one, 10-pyrido[3,2-b][1,4]-benzothiazine, urazole, hydantoin, barbituric acid, glycine anhydride, 1-hydroxybenzotriazole, alloxan, maleimide, as described in JP-A 61-219951, etc.

The dissolution accelerator may be added to the resin composition of the present invention generally in an amount of 50 parts by weight or less, preferably 30 parts by weight or less, per 100 parts by weight of the binder in the composition.

In order to elevate the light transmittance of the resist of the composition in a far-ultraviolet range, compounds to be obtained by hydrogenating the nuclei of the above-mentioned polyhydroxy compounds or, that is, low-molecular cyclic alcohols can be added to the composition. Examples thereof include 4,4'-methylene-biscyclohexanol, 4,4'-methylene-bis(2,6-dimethylcyclohexanol), 4,4',4"-methylidene-triscyclohexanol, etc.

Light absorbents may be added, if desired, to the radiation-sensitive resin composition of the present invention for the purpose of preventing the halation of substrates and for the purpose of improving the visibility of patterns formed on transparent substrates. Usable are commercial light absorbents such as those described in Technology and Market of industrial Dyes (published by CMC) and Handbook for Dyes (edited by Organic Synthetic Chemical Association). As preferred examples of such light absorbents, mentioned are C.I Disperse Yellow 1, 2, 4, 5, 7, 8, 13, 23, 31, 49, 50, 51, 54, 56, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. Disperse Violet 43; C.I. Disperse Blue 96; C.F. Fluorescent Brightening Agent 112, 135 and 163; C.I. Solvent Yellow 14, 16, 33 and 56; C.I. Solvent Orange 2 and 45; C.I. Solvent Red 1, 3, 8, 23, 24, 25, 27 and 49; C.I. Pigment Green 10; C.I. Pigment Brown 2, etc. The content of the absorbents in the composition may be generally 100 parts by weight or less, preferably 50 parts by weight or less, more preferably 30 parts by weight or less, per 100 parts by weight of the binder in the composition.

In addition, a spectral sensitizer such as those mentioned hereinbelow may be added to the composition of the present invention, by which the composition can be sensitized to rays falling within a longer wavelength range than far-ultraviolet rays to which the photo acid generator is not sensitive. The composition of the present invention thus containing such a spectral sensitizer is made sensitive to i-ray or g-ray. As preferred examples of such spectral sensitizers for use in the present invention, mentioned are benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, acridine orange benzoflavin, setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), coronene, 9,10-phenanthrenequinone, camphorquinone, thio-Michler's ketone, methyl o-benzoylbenzoate, 4-phenylbenzophenone, 4-benzoyl-4'-methyl-diphenylsulfide, 2,4- diethylthixanthone, 2,4-dichlorothioxanthone, 1-chloro-4-propoxythioxanthone, etc. However, these are not limitative.

An acid-crosslinking agent may be added to the radiation-sensitive resin composition of the present invention, as far as it has no influence on the ability of the resist of the composition to form positive images. Such crosslinking agents are added to the composition essentially for the purpose of controlling the sensitivity of the composition and improving the heat resistance and the dry-etching resistance of the resist of the composition.

Examples of such a crosslinking agent include compounds obtained by reacting melamine, benzoguanamine, glycoluril or the like with formaldehyde or their alkyl-modified derivatives (such as those shown by the following formulae (17) to (20)), as well as epoxy compounds, aldehydes, azide compounds, organic peroxides, hexamethylene-tetramine, etc.

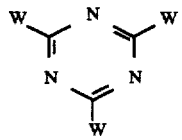
(17)

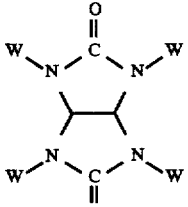
(18)

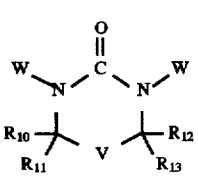
(19)

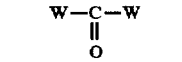
(20)

In these formulae;

W represents —N(CH$_2$OR$_{14}$)(CH$_2$OR$_{15}$) where R$_{14}$ and R$_{15}$ each represent a hydrogen atom or an alkyl group having from 1 to 5 carbon atoms;

V represents —O—, —CH$_2$—, =N—R$_{16}$, —C(R$_{17}$)(R$_{18}$)— or a single bond;

R$_{10}$ to R$_{13}$ each represent a hydrogen atom, a hydroxyl group, an alkyl group having from 1 to 5 carbon atoms, or an alkoxy group having from 1 to 5 carbon atoms;

R$_{16}$ represents a hydrogen atom or an alkyl group having from 1 to 5 carbon atoms;

R$_{17}$ and R$_{18}$ each represent a hydrogen atom, a hydroxyl group, or an alkyl group having from 1 to 5 carbon atoms.

Concretely mentioned are compounds obtained by reacting melamine and formaldehyde and their alkyl-modified derivatives, such as those described in JP-A 59-113435, 60-263143, 62-164045, 3-75652, 5-45879, 5-224420, etc. Series of commercial products are typically mentioned, such as Cymel 300, 301, 303, 350, 736, 738, 370, 771, 325, 327, 703, 701, 266, 267, 285, 232, 235, 238, 1141, 272, 254, 202, 1156, 1158, all produced by Mitsui-Cyanamid Ltd. and Nikalac Mw30, Mw30M, Mw30HM, MX45, BX-4000, all produced by Sanwa Chemical Co.

As typical commercial products of compounds obtained by reacting benzoguanamine and formaldehyde and their alkyl-modified derivatives, mentioned are Cymel 1123, 1125, 1128; as those of compounds obtained by reacting glycoluril and formaldehyde and their alkyl-modified derivatives, mentioned are Cymel 1170, 1171, 1172, 1174; and as those of compounds obtained by reacting urea and formalin and their alkyl-modified derivatives, mentioned are UFR65 and 300, both produced by Mitsui-Cyanamid Co., Ltd.

Examples of usable epoxy compounds are described in JP-A 1-293338 and 3-152543. As concrete examples, mentioned are novolak epoxy resins (YDP N-638, 701, 702, 703, 704, all produced by Tohto Kasei Co., Ltd.), amine-epoxy resins (YH-434, produced by Tohto Kasei Co., Ltd.), his-phenol A-epoxy resins, sorbitol (poly)glycidyl ether, (poly)glycerol (poly)glycidyl ether, pentaerythritol (poly)glycidyl ether, triglycidyl-tris-hydroxyethyl isocyanurate, allyl glycidyl ether, ethylhexyl glycidyl ether, phenyl glycidyl ether, phenol glycidyl ether, lauryl alcohol glycidyl ether, adipic acid glycidyl ether, phthalic acid glycidyl ether, dibromophenyl glycidyl ether, dibromoneopentyl glycol glycidyl ether, glycidyl phthalimide, (poly)ethylene glycol glycidyl ether, (poly)propylene glycol diglycidyl ether, neopentyl glycol diglycidyl ether, glycerin polyglycidyl ether, trimethylolpropane polyglycidyl ether, butyl glycidyl ether, etc.

As examples of usable aldehydes, mentioned are terephthalaldehyde, trioxane and other compounds described in JP-A 3-185449 and 4-143761. Also usable are compounds having photo- and/or thermal-polymerizing groups, such as —CH=CH$_2$, —OCH$_2$—CH=CH$_2$, —O—CH$_2$OCH$_3$, —O—(C=O)—CH$_2$CH=CH$_2$, —CH$_2$—O—C(=O)CH$_3$, —(C(=O)—)$_2$N—CH$_2$—CH=CH$_2$, etc. as described in JP-A 3-107162, JP-B 53429 and EP 543,761.

In addition, also usable are methylol derivatives as described in German Patent 4,038,711 and U.S. Pat. No. 5,019,481; methylol derivatives such as those described in JP-A 5-45878 and 5-134412; resinified derivatives such as resol resins as described in JP-B 1-49932 and British Patent 2,082,339; oxazoline or oxazine derivatives such as those described in JP-A 5-281715; and compounds having silanol groups such as those described in JP-A 2-154266 and 2-173647.

Also usable are known azide compounds as described in JP-A 63-191142. As concrete examples, mentioned are 1-azidopyrene, p-azidobenzophenone, 4'-methoxy-4-azidodiphenylamine, 4-azidobenzal-2'-methoxyacetophenone, 4-azido-4'-nitrophenylazobenzene, 4,4'-diazidobenzophenone, 4,4'-diazidobenzomethane, 4,4'-diazidostilbene, 4,4'-diazidochalcone, 4,4'-diazidodiphenylsulfone, 3,4'-diazidodiphenylsulfone, 3,3'-diazidodiphenylsulfone, 2,6'-di(4'-azidobenzal)cyclohexane, 2,6-di(4'-azidobenzal)-4-methylcyclohexane, sulfonylazidobenzene, p-sulfonylazidotoluene, p-bis(sulfonylazido)benzene, 4,4'-bis(sulfonylazido)benzophenone, 4-azidobenzalacetophenone, 4-azidobenzalacetone, 2,6-bis(4'-azidobenzal)cyclohexanone, 4,4'-diazidodiphenylmethane, 4,4'-diazidodiphenyl ether, 4,4'-diazidodiphenylsulfide, 3-(4-(azidostyryl)-5,5-dimethyl-2-cyclohexen-1-one, 1-azipyrene, etc.

Among these crosslinking agents, preferred are melamine-formaldehyde resins, benzoguanamine-formaldehyde resins, glycoluril-formaldehyde resins, their monomers and oligomers. The crosslinking agent may be added to the composition of the present invention in an amount of less than 10% by weight, preferably less than 5% by weight of based on the weight of the photo acid generator. If the amount of the crosslinking agent is more than 10% by weight, the sensitivity of the composition is lowered and the resist of the composition gives scum (resist residue) after development. Therefore, such is unfavorable.

The use of the polymer of formula (1) as a binder in chemically-amplified positive resists often causes a problem of a so-called delay time effect, by which the line width of the pattern formed is varied and the profile of the pattern formed is worsened to have a T-shaped or bridged cross section, depending on the time and the atmosphere from exposure to development. This is an ordinary problem with chemically-amplified positive resists. The reason of such a problem is considered because of the diffusion of the acids generated in the exposed areas to the non-exposed areas, the deactivation of the acids generated in the polymer due to the basic substances in air, and the loss of the acids on the surface of the resist due to vaporization of the generated acids. In order to overcome this delay time effect, various additives have heretofore been proposed. Such known additives may be added to the positive radiation-sensitive resin composition of the present invention.

As stabilizers which are especially effective to overcome the delay time effect, for example, mentioned are basic compounds as described in JP-A 63-149640, 3-241354, 5-232706, 5-249683, etc.; clathrate compounds as described in JP-A 5-165219, 5-173333, etc.; basic compounds that lose their basic property by exposure, as described in JP-A 6-11835, Proc. SPIE, Vol. 1925, 76 (1993), etc.; compounds forming bases by hydrolysis, as described in JP-A 63-149639, etc.; organic compounds reacting with water or strong anionoidic substances in the presence of an acid, as described in JP-A 4-248554, etc.; carboxylic acid derivatives, sulfonates, disulfone compounds, as described in Proc. SPIE, Vol. 1672, 46 (1992), etc.

If desired, a photo base generator, a thermal base generator, etc. can be added to the resin composition of the present invention. Examples of the photo base generator include the compounds described in JP-A 4-162040, J. Org. Chem., Vol. 55, 5919 (1990), J. Photopolym. Sci. Tech., Vol. 3, No. 3, 419 (1990), etc. Concretely mentioned are benzoincyclohexyl carbamate, 2-nitrobenzylcyclohexyl carbamate, 3,5-dimethoxybenzylcyclohexyl carbonate, N-cyclohexyl-4-methylphenylsulfonamide, N-cyclohexyl-2-naphthylsulfonamide, 3-nitrophenylcyclohexyl carbamate, triphenylmethanol, tri(4-chlorophenyl)methanol, etc.

Examples of the thermal base-generating agent include the compounds described in JP-A 5-158242.

The stabilizer may be added to the composition of the present invention preferably in an amount of less than 50% by weight, more preferably less than 30% by weight based on the total weight of the photo acid generator. If the content of the stabilizer is not less than 50% by weight, it often causes various unfavorable problems in that the sensitivity of the composition is lowered, the profile of the resist pattern to be formed is worsened, and the resolution of the resist of the composition is lowered.

In order to improve the adhesiveness between the substrate and the resist composition of the present invention so as not to make the resist peel from the substrate during etching it, an adhesiveness improving agent may be added to the composition. Examples thereof include the compounds described in JP-A 51-52002 and 53-39115, i.e., chlorosilanes such as trimethylchlorosilane, dimethylvinylchlorosilane, methyldiphenylchlorosilane, chloromethyldimethylchlorosilane, etc., alkoxysilanes such as trimethylmethoxysilane, dimethyldiethoxysilane, dimethyldimethoxysilane, dimethylvinylethoxysilane, diphenyldimethoxysilane, phenyltriethoxysilane, etc., silazanes such as hexamethyldisilazane, N,N'-bis (trimethylsilyl)urea, dimethyltrimethylsilylamine, trimethylsilylimidazole, etc., silanes such as vinyltrichlorosilane, γ-chloropropyltrimethoxysilane, γ-aminopropyltriethoxysilane, γ-glycidoxypropyltrimethoxysilane, etc.; as well as benzotriazole-carboxylic acids as described i n JP-A 62-262043; urea compounds, thiourea compounds and arylamine compounds, as described in JP-A 2-84654, etc. The adhesiveness improving agent may be added to the composition of the present invention generally in an amount of less than 10% by weight, preferably less than 5% by weight based on the weight of the binder.

The positive radiation-sensitive resin composition of the present invention may contain, if desired, a surfactant for improving the coatability of the composition such as streation. As examples of usable surfactants, mentioned are nonionic surfactants, for example, polyoxyethylene alkyl ethers such as polyoxyethylene lauryl ether, polyoxyethylene stearyl ether, polyoxyethylene cetyl ether, polyoxyethylene oleyl ether, etc., polyoxyethylene alkylaryl ethers such as polyoxyethylene octylphenol ether, polyoxyethylene nonylphenol ether, etc., polyoxyethylene-polyoxypropylene block copolymers, sorbitan fatty acid esters such as sorbitan monolaurate, sorbitan monopalmitate, sorbitan monostearate, sorbitan molooleate, sorbitan trioleate, sorbitan tristearate, etc., polyoxyethylene-sorbitan fatty acid esters such as polyoxyethylene-sorbitan monolaurate, polyoxyethylene-sorbitan monopalmitate, polyoxyethylene-sorbitan monostearate, polyoxyethylene-sorbitan trioleate, polyoxyethylene-sorbitan tristearate, etc.; fluorine-containing surfactants such as Eftop EF301, EF303, EF352 (all produced by Shin-Akita Chemical Co.), Megafac F171, F173 (both produced by Dai-Nippon Ink Co.), Fluorad $FC_{430}$, $FC_{431}$ (both produced by Sumitomo Three M's Co.), Asahiguard AG710, Surfron S-382, SC101, SC102, SC103, SC104, SC105, SC106 (all produced by Asahi Glass Co.), etc.; as well as organosiloxane polymer KP341 (produced by Shin-etsu Chemical Co.), acrylic or methacrylic acid (co) polymers, Polyflow No. 75, No. 95 (both produced by Kyoei-sha Oil and Fat Chemical Co.), etc. Among these, fluorine-containing surfactants and silicone surfactants are especially preferred. The amount of the surfactant is generally 2 parts by weight or less, preferably 1 part by weight or less per 100 parts by weight of the solid content of the composition. The composition of the present invention may contain one or more of these surfactants.

To coat the positive radiation-sensitive resin composition of the present invention on a substrate, the above-mentioned components of the composition are dissolved in a solvent, e.g., in a concentration of 10 to 50 wt %, and the resulting solution is coated on a substrate. As examples of usable solvents, mentioned are ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, methyl α-hydroxyisobutyrate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, n-amyl acetate, isoamyl acetate, 2-heptanone, anisole, diacetone alcohol, diethyl carbonate, 4-methoxy-4-methyl-2-pentanone, etc.

These solvents can be used as a mixed solvent with a high boiling point solvent such as N-methylformamide, N,N-dimethylformamide, N-methylacetamide, N,N-dimethylacetamide, N-methylpyrrolidone, dimethylsulfoxide, benzyl ethyl ether, etc. These organic solvents can be used singly or as their mixtures so as to improve the coatability of the resist solutions to be uniformly coated on substrates and to improve the stability of the resist solutions during storage.

The above-mentioned photosensitive composition is coated on a substrate that is used for producing precision integration circuit elements (for example, transparent substrates such as silicon/silicon dioxide-coated glass substrates, ITO substrates, etc.) according to suitable coating methods using a spinner, a coater, etc., then exposed through a pre-determined mask, baked and developed to give good resist patterns.

As developers usable for developing the positive radiation-sensitive resin composition of the present invention, mentioned are aqueous alkaline solutions containing, for example, inorganic alkalis such as sodium hydroxide, potassium hydroxide, sodium carbonate, sodium silicate, sodium metasilicate, aqueous ammonia, etc., primary amines such as ethylamine, n-propylamine, etc., secondary amines such as diethylamine, di-n-butylamine, etc., tertiary amines such as triethylamine, methyldiethylamine, etc., alcoholamines such as diethanolamine, triethanolamine, etc., quaternary ammonium salts such as tetramethylammonium hydroxide, tetraethylammonium hydroxide, choline, etc., cyclic amines such as pyrrole, piperidine, etc. Among such developing agents, especially preferred are quaternary ammonium salts, even more preferably tetramethylammonium hydroxide and choline.

The alkali concentration in these aqueous alkaline solutions is preferably from 0.001 to 1N, more preferably from 0.01 to 0.5N, most preferably from 0.05N to 0.3N. If desired, these aqueous alkaline solutions may contain suitable amounts of alcohols and surfactants.

The present invention will be describe in more detail by means of the following examples, which, however, are not intended to restrict the scope of the present invention.

PRODUCTION EXAMPLE 1

188 g of phenol were put into a 500 ml-flask and melted therein at 80° C. 1.42 g of $BF_3$ ethyl ether were added thereto, and 66 g of dicyclopentadiene were dropwise added thereto over a period of 3 hours. Afterwards, 61.7 g of an aqueous solution of 35% formaldehyde were dropwise added thereto over a period of 2 hours and reacted for one hour to obtain a reaction mixture containing a modified phenolic resin. The non-reacted phenol was removed from this by distillation at reduced pressure at 100° to 180° C. 550 g of toluene were added thereto and dissolved. 900 g of ion-exchanged water were added thereto, and this was washed by shaking. This washing was repeated 5 times or more. Toluene was removed from this by distillation under reduced pressure at 100° to 180° C. Then, this was cooled to obtain about 220 g of a modified phenolic resin A.

PRODUCTION EXAMPLES 2 TO 4

In the same manner as in Production Example 1, modified phenolic resins B, C and D were obtained from the components shown in Table 1 below.

PRODUCTION EXAMPLE 5

186 g of dicyclopentadiene-modified phenolic resin having a number average molecular weight of 485 were put into a 500 ml-flask, 115 g of phenol were added thereto, and these were melted at 100° C. 5 g of 35% hydrochloric acid were added thereto, and 77.1 g of an aqueous solution of 35% formaldehyde were dropwise added thereto, while stirring, over a period of 2 hours and reacted for one hour to obtain a reaction mixture containing a modified phenolic resin.

This was treated in the same manner as in Production Example 1, and about 249 g of a modified phenolic resin E were obtained.

PRODUCTION EXAMPLE 6

In the same manner as in Production Example 5, a modified phenolic resin F was obtained from the components shown in Table 1 below.

The reaction conditions in these Production Examples are shown in Table 1 below along with the number average molecular weights of the resins obtained therein.

TABLE 1

| | Reaction Conditions and Number Average Molecular Weights of Resins Obtained | | | | | | | |
|---|---|---|---|---|---|---|---|---|
| Production | First Stage Reaction | | | Second Stage Reaction | | | | Number Average Molecular |
| Example No. | Phenol | DCPD[1] | Catalyst[2] | HCHO[3] | Phenol | Catalyst[4] | Yield | Weight |
| 1 | 188 | 66 | 1.42 | 61.7 | — | — | 220 | 889 |
| 2 | 235 | 66 | 1.77 | 77.1 | — | — | 255 | 728 |
| 3 | 329 | 66 | 2.48 | 108.0 | — | — | 295 | 814 |
| 4 | 470 | 66 | 3.54 | 154.3 | — | — | 389 | 701 |
| 5 | DCPD-modified phenolic resin 186 | | | 77.1 | 115 | 5.0 | 249 | 966 |
| 6 | DCPD-modified phenolic resin 196 | | | 108.0 | 199 | 5.0 | 307 | 818 |

[1]DCPD = Dicyclopentadiene
[2]$BF_3$ ethyl ether
[3]Aqueous solution of 35% by weight formaldehyde
[4]Aqueous solution of 35% by weight hydrochloric acid
The number average molecular weight of each resin was obtained by GPC based on polystyrene.

PRODUCTION EXAMPLE 7

186 g of dicyclopentadiene-modified phenolic resin having a number average molecular weight of 485 were put into a 500 ml-flask, and 92 g of m-cresol and 40 g of p-cresol were added thereto and melted at 100° C. 5.8 g of oxalic acid were added thereto, and 84.8 g of an aqueous solution of 35% formaldehyde were dropwise added thereto, while stirring, over a period of 3 hours and reacted for further 4 hours to obtain a reaction mixture containing a modified phenolic resin.

The non-reacted monomers, oxalic acid and formaldehyde were removed from this by distillation at reduced pressure at 100° to 200° C. Then, 550 g of toluene were added thereto and dissolved. 900 g of ion-exchanged water were added thereto, and this was washed by shaking. This washing was repeated 5 times or more. Toluene was removed from this by distillation under reduced pressure at 100° to 180° C. Then, this was cooled to obtain 191 g of a modified phenolic resin G.

This had a number average molecular weight of 1492, a weight average molecular weight of 4625, and a softening point of 119° C.

PRODUCTION EXAMPLE 8

186 g of dicyclopentadiene-modified phenolic resin having a number average molecular weight of 683 were put into a 500 ml-flask, and 58 g of phenol, 76 g of p-cresol were added thereto and melted at 100° C. This was then treated in the same manner as in Production Example 7. Thus, about 193 g of a modified phenolic resin H were obtained.

This had a number average molecular weight of 1376, a weight average molecular weight of 4990, and a softening point of 120° C.

PRODUCTION EXAMPLE 9

186 g of dicyclopentadiene-modified phenolic resin having a number average molecular weight of 683 were put into a 500 ml-flask, and 106 g of m-cresol and 36 g of 3,5-dimethylphenol were added thereto and melted at 100° C. This was then treated in the same manner as in Production Example 7. Thus, about 187 g of a modified phenolic resin I were obtained.

This had a number average molecular weight of 1106, a weight average molecular weight of 2875, and a softening point of 127° C.

PRODUCTION EXAMPLE 10

186 g of dicyclopentadiene-modified phenolic resin having a number average molecular weight of 485 were put into a 500 ml-flask, and 106 g of m-cresol and 26 g of p-cresol were added thereto and melted at 100° C. This was then treated in the same manner as in Production Example 7. Thus, about 194 g of a modified phenolic resin were obtained. 60 g of this modified phenolic resin were completely dissolved in 180 g of methanol, and 90 g of water were gradually added thereto, while stirring, by which resin solids were precipitated. The upper layer was removed by decantation, and the resin precipitate was collected. This was dried by heating it at 40° C. under reduced pressure for 24 hours, and a modified phenolic resin J was obtained. By the above-mentioned fractionating re-precipitation, about 34% of the low-molecular components were removed from this modified phenolic resin J. This resin had a number average molecular weight of 1896, a weight average molecular weight of 6820, and a softening point of 147° C.

PRODUCTION EXAMPLE 11

Production of Novolak Resin 40 g of m-cresol, 60 g of p-cresol, 49 g of an aqueous solution of 37% formalin and 0.13 g of oxalic acid were put into a three-neck flask, heated up to 100° C. while stirring and reacted for 15 hours. Afterwards, this was further heated up to 200° C., and the pressure in the flask was gradually reduced to 5 mmHg whereby water, the non-reacted monomers, formaldehyde and oxalic acid were removed from the reaction mixture. The molten alkali-soluble novolak resin thus produced was cooled to room temperature and collected. The thus-obtained novolak resin had a number average molecular weight of 1670, a weight average molecular weight of 7100 and a softening point of 142° C.

PRODUCTION EXAMPLE 12

Production of Hydrogenated Novolak Resin 50 g of m/p (50/50) cresol-novolak resin and 450 g of ethanol were put into an autoclave and well mixed to dissolve the polymer. Next, 6.0 g of Raney nickel were added thereto, the atmosphere in the autoclave was substituted by nitrogen, and a hydrogen pressure of 50 kg/cm$^2$ was applied thereto at 20° C. Thus, the system in the autoclave was kept as it was for 30 minutes. Afterwards, this autoclave was dipped in a hot bath at 50° C., in which the hydrogenation was conducted for 3 hours. The Raney nickel was removed by filtration from the reaction mixture, and the reaction mixture was then put into water whereby the polymer was precipitated. The thus-obtained polymer was dissolved in dioxane and then freeze-dried for 36 hours to obtain 40 g of a dry polymer. The hydrogenated novolak resin thus obtained had a weight average molecular weight of 5800. The degree of hydrogenation of the polymer was measured to be 35% by nuclear magnetic resonance (NMR).

PRODUCTION EXAMPLE 13

Production of Photo Acid Generator (PAG 5-6)

11.8 g of sodium p-toluenesulfinate dihydrate were dissolved in 20 ml of water, and 11.3 g of α-naphthalenesulfonic acid chloride were added thereto and reacted for 24 hours at room temperature while stirring. 250 ml of water were added thereto, the precipitate formed were taken out by filtration, and this was recrystallized from a mixed solvent comprising benzene and ethanol. Thus, 6.5 g of α-naphthyl-p-methylphenyldisulfone (PAG 5-6) were obtained.

PRODUCTION EXAMPLES 14 AND 15

Production of Photo Acid Generators (PAG 5-12, PAG 5-13)

In the same manner as in Production Example 13, photo acid generators PAG 5-12 and PAG 5-13 were obtained.

PRODUCTION EXAMPLE 16

Production of Photo Acid Generator (PAG 3-22)

36 g of diphenyl iodonium perchlorate were dissolved in 500 g of water. To the resulting aqueous solution, gradually and dropwise added were an aqueous solution of 34 g of sodium 9,10-dimethoxyanthracene-2-sulfonate dissolved in 500 g of water. Next, this mixture was stirred for 2 hours and the product was precipitated. This product was taken out by filtration and washed with 200 g of water. Next, this was dried at 40° C. under reduced pressure to obtain 51 g of diphenyliodonium 9,10-dimethoxyanthracene-2-sulfonate (PAG 3-22).

PRODUCTION EXAMPLE 17

Production of Photo Acid Generator (PAG 7-1)

An ethanol solution of 12.0 g (0.21 mols) of potassium hydroxide was dropwise added to 20.2 g (0.17 mols) of cyclohexylthiol and stirred at 30° C. for 30 minutes. Next, 18.2 g (2.14 mols) of dichloromethane were added thereto and reacted at 50° C. for 6 hours. This was left at room temperature overnight, then 55 g of ethanol were added thereto to dilute the reaction mixture, 400 mg of sodium tungstate were added thereto, and 50 g (0.44 mols) of aqueous 30% hydrogen peroxide were dropwise added thereto at 45° to 50° C. and reacted at 50° C. for 4 hours. After the reaction, 200 ml of water were added to the reaction mixture, this was left at room temperature overnight, and the precipitate formed was taken out by filtration, washed with water and dried to obtain 20 g of crude crystals. These were recrystallized from ethanol to obtain 14 g of PAG 7-1.

PRODUCTION EXAMPLE 18

Production of Photo Acid Generator a 11.0 g of sodium borohydride were dissolved in 160 ml of 0.2N sodium hydroxide at room temperature. The resulting solution was dropwise added to a methanol solution comprising 100 g of 2,6-dinitrobenzaldehyde. This was stirred for 30 minutes at room temperature. Afterwards, methanol was removed therefrom by distillation, and the residue was extracted several times each with diethyl ether. The ether extracts were dried with anhydrous magnesium sulfate and filtered. The solvent was removed under reduced pressure, using a rotary evaporator, and the residue was recrystallized three times each from chloroform/carbon tetrachloride, to obtain 90.2 g of 2,6-dinitrobenzyl alcohol. 20 g of this 2,6-dinitrobenzyl alcohol and 23.7 g of p-toluenesulfonyl chloride were dissolved in 150 ml of acetone to prepare a solution. An acetone solution comprising 2.25 ml of dicyclohexylamine was dropwise added to the solution and stirred at 25° C. for 24 hours. Afterwards, the reaction mixture was treated and recrystallized in the same manner as in the treatment of the above-mentioned 2,6-dinitrobenzyl alcohol, and 22.3 g of 2,6-dinitrobenzyltosylate (photo acid generator a) having the following formula were obtained.

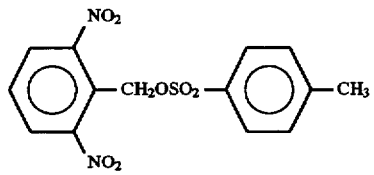

PRODUCTION EXAMPLE 19

Production of Photo Acid Generator b 12.4 g of pyrogallol were dissolved in 63.2 g of pyridine, and 42.3 g of methanesulfonyl chloride were gradually and dropwise added thereto, while stirring, and reacted for further 3 hours at 70° C. The reaction mixture was poured into water, and the precipitate formed was taken out by filtration, washed with water and dried in vacuum to obtain 32.8 g of a methanesulfonate (photo acid generator b) having the following formula.

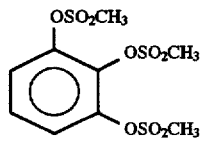

PRODUCTION EXAMPLE 20

Production of Photo Acid Generator c

α-Hydroxyiminobenzylcyanide was produced according to the method described in Org. Syn., Vol. 59, No. 95 (1979). 40 g (0.28 mols) of this compound, 600 ml of methylene chloride and 39 ml (0.3 mols) of triethylamine were put into a three-neck flask. 53.0 g (0.28 mols) of p-toluenesulfonyl chloride were gradually and dropwise added to the resulting solution at 0° C. Afterwards, this was stirred at 25° C. for 12 hours, 750 ml of water were added to the reaction mixture, and the organic layer was separated, washed with water and dried with sodium sulfate. The solvent was removed by distillation under reduced pressure, and the product was recrystallized from ethyl acetate/hexane. Thus, 39 g of o-(p-toluenesulfonyl)-α-hydroxyiminobenzylcyanide (photo acid generator c) having the following formula were obtained.

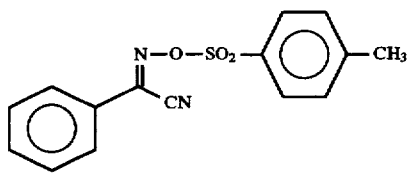

PRODUCTION EXAMPLE 21

Production of Photo Acid Generator d 0.1 mol of cyclohexane-dioxime, 0.2 mols of pyridine and 100 ml of dry tetrahydrofuran were put into a flask, and 0.18 mols of methanesulfonyl acid chloride were added thereto while stirring at room temperature. After this was stirred for further 5 hours, tetrahydrofuran was removed by distillation, and the product was poured into water. The product was extracted with ethyl ether. The resulting crude extract was collected by distillation. Thus, a photo acid generator d having the following formula was obtained.

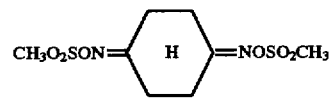

PRODUCTION EXAMPLE 22

Production of Photo Acid Generator e 15.5 g of sodium anthraquinone-2-sulfonate, 5 g of zinc powder and 20 ml of ethanol were put into a 500 ml-flask, stirred and dispersed. 100 g of a solution of 20% sodium hydroxide were added to the resulting dispersion, heated and refluxed for one hour, whereupon the reaction mixture was dissolved in dark red. Next, 60 ml of dimethyl sulfate were gradually and dropwise added thereto. After this was cooled, the precipitate formed was taken out therefrom by filtration and washed with an aqueous solution of hydrogen sulfide, by which the non-reacted sodium anthraquinone-2-sulfonate was removed. Next, the product was dissolved in a large amount of hot water and filtered to remove zinc therefrom. Then, water was removed, and 10 g of sodium 9,10-dimethoxyanthracene-2-sulfonate were obtained. 10 g of sodium 9,10-dimethoxyanthracene-2-sulfonate thus obtained were dispersed in 40 ml of benzene, and 12 g of phosphorus pentachloride were gradually added thereto. This was stirred for 30 minutes at room temperature and filtered. Then, benzene was removed from this by distillation, and 13.5 g of 9,10-dimethoxyanthracene-2-sulfonyl chloride were obtained. 9.2 g of 9,10-dimethoxyanthracene-2-sulfonyl chloride, 6.2 g of p-nitrobenzylalcohol and 40 ml of tetrahydrofuran were put into a 200 ml-flask, and 6 g of an aqueous solution of 30% sodium hydroxide were gradually and dropwise added thereto at 5° C. This was stirred for 3 hours at 5° C., 100 ml of water were added thereto and stirred at room temperature for 60 minutes, and the precipitate formed was taken out by filtration and washed with water and then with methanol. Thus, 14 g of p-nitrobenzyl 9,10-dimethoxyanthracene-2-sulfonate (photo acid generator e) having the following formula were obtained.

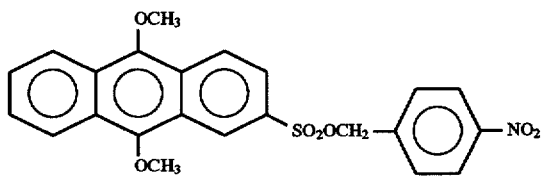

PRODUCTION EXAMPLES 23 AND 24

Production of Photo Acid Generators (PAG 6-2 and PAG 6-14)

According to the method described in U.S. Pat. No. 4,371,605, photo acid generators PAG 6-2 and PAG 6-14 were produced.

PRODUCTION EXAMPLE 25

Production of Photo Acid Generator f

According to the method described in U.S. Pat. No. 5,151,340, a photo acid generator f having the following formula was produced.

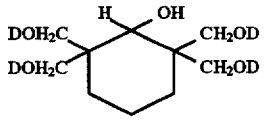

In this formula, D represents 1,2-naphthoquinonediazido-4-sulfonyl group.

PRODUCTION EXAMPLE 26

Production of Photo Acid Generator g 35.5 g of α,α',α"-tris(4-hydroxyphenyl)-1-ethyl-4-isopropylbenzene, 53.7 g of 1,2-naphthoquinonediazido-5-sulfonyl chloride and 800 ml of acetone were put into a three-neck flask and dissolved uniformly. Next, 21.2 g of triethylamine were gradually and dropwise added thereto and reacted at 25° C. for 3 hours. The reaction mixture was poured into 3 liters of an aqueous solution of 1% by weight hydrochloric acid, and the precipitate formed was taken out by filtration, washed with water and dried. Thus, 75 g of a photo acid generator g having the following formula were obtained.

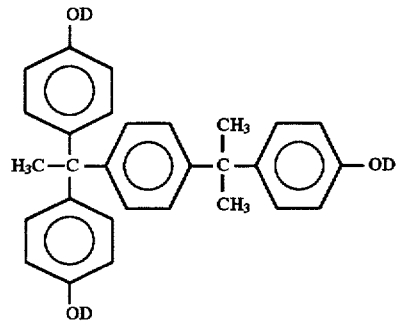

PRODUCTION EXAMPLE 27

Production of Photo Acid Generator h 19.19 g of 2,3,4,4'-tetrahydroxybenzophenone, 53.7 g of 1,2-naphthoquinonediazido-5-sulfonyl chloride and 800 ml of acetone were put into a three-neck flask and dissolved uniformly. Next, 21.2 g of triethylamine were gradually and dropwise added thereto and reacted at 25° C. for 3 hours. The reaction mixture was poured into 3 liters of an aqueous solution of 1% hydrochloric acid, and the precipitate formed was taken out by filtration, washed with water and dried. Thus, 62.3 g of a photo acid generator h having the following formula were obtained.

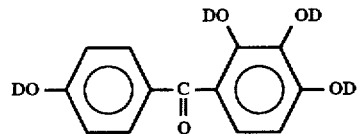

PRODUCTION EXAMPLE 28

Production of Dissolution Inhibitor 20 g of α,α',α"-tris(4-hydroxyphenyl)-1,3,5-triisopropylbenzene were dissolved in 400 ml of tetrahydrofuran. 14 g of tert-butoxy potassium were added to the resulting solution in nitrogen atmosphere, stirred at room temperature for 10 minutes, and then 29.2 g of di-tert-butyl dicarbonate were added thereto. These were reacted at room temperature for 3 hours, and the reaction mixture was poured into water with ice and then extracted with ethyl acetate. The ethyl acetate layer was washed with water and dried, and the solvent was removed therefrom by distillation. The thus-obtained crystalline solid was recrystallized from diethyl ether and dried to obtain 25.6 g of Compound (19) (where all R's are t-BOC groups).

PRODUCTION EXAMPLE 29

Production of Dissolution Inhibitor 20 g of α,α',α"-tris(4-hydroxyphenyl)-1,3,5-triisopropylbenzene were dissolved in 400 ml of diethyl ether. 31.6 g of 3,4-dihydro-2H-pyrane and a catalytic amount of hydrochloric acid were added to the resulting solution in nitrogen atmosphere and reacted for 24 hours under reflux. After the reaction, a small amount of sodium hydroxide was added to the reaction mixture, which was then filtered. The solvent was removed from the resulting filtrate, and the product thus obtained was purified by column chromatography and dried. Compound (19) (where all R's are THP groups) was obtained.

PRODUCTION EXAMPLE 30

Production of Dissolution Inhibitor

To 120 ml of an N,N-dimethylacetamide solution comprising 19.2 g (0.040 mols) of α,α',α"-tris(4-hydroxyphenyl)-1,3,5-triisopropylbenzene, added were 21.2 g (0.15 mols) of potassium carbonate and then 27.1 g (0.14 mols) of t-butyl bromoacetate, and these were stirred at 120° C. for 7 hours. The reaction mixture was poured into 1.5 liters of water and then extracted with ethyl acetate. The extract was dried with magnesium sulfate, concentrated and then purified by column chromatography (carrier: silicagel, developing solvent: ethyl acetate/n-hexane=3/7 by volume) to obtain 30 g of a pale yellow viscous solid. By NMR, this was identified to be Compound (19) (where all R's are —CH$_2$COO-t-C$_4$H$_9$).

PRODUCTION EXAMPLE 31

Production of Dissolution Inhibitor 42.4 g (0.10 mol) of 1-[α-methyl-α-(4'-hydroxyphenyl)ethyl]-4-[α',α'-bis(4"-hydroxyphenyl)ethyl]benzene were dissolved in 300 ml of N,N-dimethylacetamide, and 49.5 g (0.35 mols) of potassium carbonate and 84.8 g (0.33 mols) of cumyl bromoacetate were added thereto. Afterwards, these were stirred at 120° C. for 7 hours. The reaction mixture was poured into 2 liters of ion-exchanged water, then neutralized with acetic acid and thereafter extracted with ethyl acetate. The ethyl acetate extract was concentrated and then purified in the same manner as in Production Example 30. Thus, 70 g of Compound (9) (where all R's are —CH$_2$COOC(CH$_3$)$_2$C$_6$H$_5$) were obtained.

PRODUCTION EXAMPLE 32

Production of Dissolution Inhibitor

To 120 ml of an N,N-dimethylacetamide solution comprising 14.3 g (0.020 mols) of α,α,α',α',α",α"-hexakis(4-hydroxyphenyl)-1,3,5-triethylbenzene, added were 21.2 g (0.15 mols) of potassium carbonate and then 27.1 g (0.14 mols) of t-butyl bromoacetate, and these were stirred at 120° C. for 7 hours. The reaction mixture was poured into 1.5 liters of water and then extracted with ethyl acetate. The extract was dried with magnesium sulfate, concentrated and then purified by column chromatography (carrier: silicagel, developing solvent: ethyl acetate/n-hexane=2/8 by volume) to obtain 24 g of a powdery pale yellow product. By NMR, this was identified to be Compound (45) (where all R's are —CH$_2$COO-t-C$_4$H$_9$).

PRODUCTION EXAMPLE 33

Production of Dissolution Inhibitor 20 g (0.042 mols) of α,α',α"-tris(4-hydroxyphenyl)-1,3,5-triisopropylbenzene were dissolved in 400 ml of tetrahydrofuran (THF). 9.3 g (0.083 mols) of t-butoxy potassium were added to the resulting solution in nitrogen atmosphere and stirred at room temperature for 10 minutes, and 19.5 g (0.087 mols) of di-t-butyl dicarbonate were added thereto. These were reacted at room temperature for 3 hours, and the reaction mixture was poured into water with ice and then extracted with ethyl acetate.

The ethyl acetate extract was concentrated and then purified by fractional column chromatography (carrier: silica gel, developing solvent: ethyl acetate/n-hexane=1/5 by volume) to obtain 7 g of Compound (19) (where two R's are t-BOC groups and one R is a hydrogen atom).

PRODUCTION EXAMPLE 34

Production of Dissolution Inhibitor 48.1 g (0.10 mol) of α,α',α"-tris(4-hydroxyphenyl)-1,3,5-triisopropylbenzene were dissolved in 300 ml of dimethylacetamide. 22.1 g (0.16 mols) of potassium carbonate and 42.9 g (0.22 mols) of t-butyl bromoacetate were added thereto. These were stirred at 120°C. for 5 hours. The reaction mixture was poured into 2 liters of ion-exchanged water, neutralized with acetic acid and then extracted with ethyl acetate.

The ethyl acetate extract was concentrated and then purified by fractional column chromatography (carrier: silica gel, developing solvent: ethyl acetate/n-hexane=1/5 by volume) to obtain 10 g of Compound (19) (where two R's are —CH$_2$—COO-t-C$_4$H$_9$ groups and one R is a hydrogen atom).

PRODUCTION EXAMPLE 35

In the same manner as in Production Example 32, the following compound (70) was obtained.

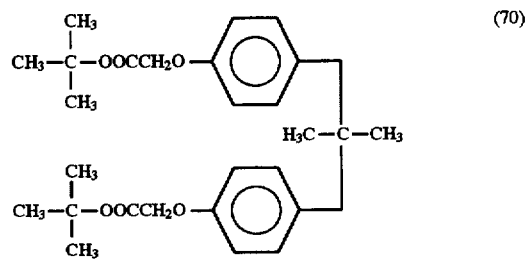

PRODUCTION EXAMPLE 36

Production of Resin (Compound (i)) having groups capable of being decomposed by acids (1) A catalytic amount of 2,2'-azobisisobutyronitrile was added to 17.6 g of p-tert-butoxystyrene, which was polymerized for 6 hours at 80° C. in a toluene solvent in nitrogen atmosphere. The reaction mixture was cooled and then poured into methanol, and the crystals thus precipitated were taken out by filtration, washed with methanol and dried to obtain 15.5 g of a white powdery product of poly(p-tert-butoxystyrene). This had a weight average molecular weight of 12,400.

(2) 15.0 g of this white powder of poly(p-tert-butoxystyrene) were dissolved in 1,4-dioxane, and 10 ml of concentrated hydrochloric acid were added thereto and stirred under reflux for 2.5 hours. After cooled, the reaction mixture was poured into water, and the crystals thus precipitated were taken out by filtration, washed with water and dried under reduced pressure to obtain 9 g of a white powdery product of poly(p-tert-butoxystyrene-p-hydroxystyrene). The ratio of the p-tert-butoxystyrene units to the p-hydroxystyrene units in the thus-obtained polymer was found to be 1/3 by $^1$H-NMR. The polymer had a weight average molecular weight of 9,800.

PRODUCTION EXAMPLE 37

Production of Resin (Compound (ii)) having groups capable of being decomposed by acids 9 g of poly(p-hydroxystyrene) (having a weight average molecular weight of 9,600) were dissolved in 100 ml of dimethoxyethane, and 12.6 g of 3,4-dihydro-2H-pyrane and 0.5 ml of sulfuric acid were added thereto and stirred for 15 hours at 30° to 40° C. After the reaction, the reaction mixture was concentrated under reduced pressure, the resulting residue was neutralized with sodium carbonate and put into water, and the crystals thus precipitated were taken out by filtration, washed with water and dried under reduced pressure to obtain 11.0 g of a white powdery product of poly(p-tetrahydropyranyloxystyrene-p-hydroxystyrene). The ratio of the p-tetrahydropyranyloxystyrene units to the p-hydroxystyrene units in the thus-obtained polymer was found to be 3/7 by $^1$H-NMR.

EXAMPLES 1 TO 13 AND COMPARATIVE EXAMPLES 1 TO 5

Preparation and Evaluation (Part 1) of Radiation-Sensitive Resin Compositions

The components shown in Table 2 below were dissolved in 6 g of propylene glycol monomethyl ether acetate and filtered through a filter having a pore size of 0.10 μm to prepare various resist liquids. Each of these resist liquids was coated on a silicon wafer, using a spin coater, and dried on a vacuum-suction hot plate at 120° C. for 60 seconds to form, on the wafer, a resist film having a thickness of 1.0 μm.

This resist film was exposed, using a KrF excimer laser stepper (NA=0.45), immediately heated on a vacuum-suction hot plate at 90° C. for 60 seconds, then dipped in an aqueous solution of 2.38% tetramethylammonium hydroxide (TMAH) for 60 seconds, rinsed in pure water for 30 seconds and dried. The pattern thus formed on the silicon wafer was observed with a scanning electronic microscope to evaluate the profile of the resist pattern formed. The results are shown in Table 3 below.

TABLE 2

| | Formulation of Radiation-Sensitive Resin Composition | | | | | |
|---|---|---|---|---|---|---|
| | Alkali-soluble Resin | | Dissolution Inhibitor | | Photo Acid Generator | |
| No. | Kind | Amount (g) | Kind | Amount(g) | Kind | Amount (g) |
| Example 1 | Production Example 1 | 1.35 | Production Example 29 | 0.45 | PAG 5-6 | 0.060 |
| Example 2 | Production Example 2/ B-1*[1] | 0.70/0.70 | Production Example 33 | 0.49 | PAG 5-12 | 0.055 |
| Example 3 | Production Example 3/ Production Example 12 | 0.70/0.70 | Production Example 32 | 0.46 | PAG 5-13 | 0.065 |
| Example 4 | Production Example 4/ B-2*[2] | 1.0/0.4 | Production Example 28 | 0.47 | PAG 7-1 | 0.057 |
| Example 5 | Production Example 5/ Production Example 11 | 0.68/0.68 | Production Example 30 | 0.48 | Production Example 18 | 0.060 |
| Example 6 | Production Example 6 | 1.36 | Production Example 31 | 0.47 | Production Example 19 | 0.053 |
| Example 7 | Production Example 7 | 1.38 | Production Example 34 | 0.49 | Production Example 20 | 0.060 |
| Example 8 | Production Example 8/ Production Example 11 | 0.70/0.70 | Production Example 28 | 0.45 | Production Example 21 | 0.057 |
| Example 9 | Production Example 9 | 1.40 | Production Example 29 | 0.49 | Production Example 22 | 0.059 |
| Example 10 | Production Example 10/ S-1*[3] | 1.19/0.21 | Production Example 30 | 0.47 | Production Example 23 | 0.055 |
| Example 11 | Production Example 5/ Production Example 11 | 0.83/0.55 | Production Example 31 | 0.46 | Production Example 24 | 0.056 |
| Example 12 | Production Example 7 | 1.40 | Production Example 32 | 0.48 | Production Example 25 | 0.062 |
| Example 13 | Production Example 9 | 1.30 | Production Example 34 | 0.49 | PAG 4-5 | 0.057 |
| Comparative Example 1 | Production Example 11 | 1.35 | Production Example 29 | 0.45 | Production Example 19 | 0.060 |
| Comparative Example 2 | B-2 | 1.36 | Production Example 31 | 0.47 | PAG 5-6 | 0.053 |
| Comparative Example 3 | Production Example 11 | 1.38 | Production Example 33 | 0.49 | Production Example 23 | 0.060 |
| Comparative Example 4 | B-1 | 1.05 | Production Example 37 | 0.80 | PAG 4-5 | 0.055 |
| Comparative Example 5 | Production Example 12 | 1.10 | Production Example 35 | 1.00 | PAG 4-5 | 0.060 |

B-1: Maruka Lyncur PHM-C, produced by Maruzen Petrochemical Co., Ltd.
B-2: Maruka Lyncur M, produced by Maruzen Petrochemical Co., Ltd.
S-1: 1-[α-methyl-α-(4'-hydroxyphenyl)ethyl]-4-[α,α'-bis(4"-hydroxyphenyl)ethyl]benzene

TABLE 3

Results of Evaluation of Properties of Resist

| No. | Resolution (μm) | Profile of Resist Pattern (θ) | Heat Resistance (°C.) | Storage Stability |
|---|---|---|---|---|
| Example 1 | 0.30 | 89 | 140 | A |
| Example 2 | 0.28 | 89 | 140 | A |
| Example 3 | 0.30 | 88 | 140 | A |
| Example 4 | 0.30 | 88 | 140 | A |
| Example 5 | 0.30 | 89 | 150 | A |
| Example 6 | 0.30 | 89 | 140 | A |
| Example 7 | 0.28 | 88 | 140 | A |
| Example 8 | 0.30 | 89 | 150 | A |
| Example 9 | 0.30 | 88 | 160 | A |
| Example 10 | 0.30 | 88 | 160 | A |
| Example 11 | 0.30 | 89 | 160 | A |
| Example 12 | 0.30 | 88 | 150 | A |
| Example 13 | 0.28 | 88 | 140 | A |
| Comparative Example 1 | 0.40 | 71 | 140 | A |
| Comparative Example 2 | 0.35 | 87 | 150 | A |
| Comparative Example 3 | 0.35 | 74 | 140 | A |
| Comparative Example 4 | 0.35 | 87 | 140 | C |
| Comparative Example 5 | 0.40 | 85 | 140 | B |

The resolution indicates the limiting resolving power at the exposure for reproducing a standard mask size of 0.4 μm.

The profile of the resist pattern formed indicates the angle (θ) given by the side wall of the cross section of the pattern of 0.50 μm and the surface of the silicon wafer having the pattern thereon.

The heat resistance indicates the temperature at which the silicon wafer having the resist pattern thereon was baked on a hot plate for 4 minutes without deformation of the pattern.

The dry etching resistance indicates the degree of the deformation, if any, of the resist pattern after dry etching. "A" means that the pattern was not deformed ; "B" means that the pattern was deformed a little; and "C" means that the pattern was deformed.

From the results shown in Table 3 above, it is known that the resists of the present invention had high resolution, when exposed to excimer lasers, and gave patterns with good profiles, while having high dry etching resistance and high heat resistance.

EXAMPLES 14 TO 18 AND COMPARATIVE EXAMPLES 6 TO 8

Preparation and Evaluation (Part 2) of Radiation-Sensitive Resin Compositions

The components shown in Table 4 below were mixed with 6 g of propylene glycol monomethyl ether acetate to form a uniform solution, and this was filtered through a Teflon filter having a pore size of 0.10 μm. Thus, various resist liquids were prepared. Each of these resist liquids was coated on a silicon wafer, using a spin coater, and dried on a vacuum-suction hot plate at 100° C. for 60 seconds to form, on the wafer, a resist film having a thickness of 0.97 μm.

This resist film was exposed, using a reduction projector (NSR-2005i9C with NA=0.57, produced by Nikon Co.), heated at 110° C. for 60 seconds, then dipped in an aqueous solution of 2.38% tetramethylammonium hydroxide (TMAH) for 60 seconds, rinsed in pure water for 30 seconds and dried. The pattern thus formed on the silicon wafer was observed with a scanning electronic microscope to evaluate the profile of the resist pattern in the same manner as mentioned above. The results are shown in Table 5 below.

TABLE 4

Formulation of Radiation-Sensitive Resin Composition

| No. | Alkali-soluble Resin Kind | Amount (g) | Dissolution Inhibitor Kind | Amount(g) | Photo Acid Generator Kind | Amount (g) |
|---|---|---|---|---|---|---|
| Example 14 | Production Example 8 | 1.05 | Production Example 36 | 0.80 | PAG 4-4 | 0.055 |
| Example 15 | Production Example 2/ Production Example 11 | 0.60/0.55 | Production Example 37/ Production Example 30 | 0.80 | Production Example 19 | 0.060 |
| Example 16 | Production Example 4 | 1.36 | Production Example 31 | 0.60 | Production Example 16 | 0.10 |
| Example 17 | Production Example 10/ S-1 | 1.14/0.29 | — | — | Production Example 25 | 0.48 |
| Example 18 | Production Example 1 | 1.42 | — | — | Production Example 26 | 0.51 |
| Comparative Example 6 | Production Example 11 | 1.35 | — | — | Production Example 27 | 0.45 |
| Comparative Example 7 | Production Example 11 | 1.40 | Production Example 35 | 0.49 | PAG 4-5 | 0.06 |
| Comparative Example 8 | Production Example 11 | 1.36 | Production Example 35 | 0.30 | Production Example 16 | 0.10 |

TABLE 5

Results of Evaluation of Properties of Resist

| No. | Resolution (μm) | Profile of Resist Pattern (θ) | Heat Resistance (°C.) | Storage Stability |
|---|---|---|---|---|
| Example 14 | 0.30 | 89 | 150 | A |
| Example 15 | 0.30 | 88 | 140 | A |
| Example 16 | 0.30 | 89 | 140 | A |
| Example 17 | 0.30 | 89 | 160 | A |

TABLE 5-continued

| | Results of Evaluation of Properties of Resist | | | |
|---|---|---|---|---|
| No. | Resolution (μm) | Profile of Resist Pattern (θ) | Heat Resistance (°C.) | Storage Stability |
| Example 18 | 0.30 | 89 | 150 | A |
| Comparative Example 6 | 0.40 | 80 | 140 | A |
| Comparative Example 7 | 0.45 | 82 | 140 | A |
| Comparative Example 8 | 0.35 | 83 | 140 | A |

As has been described in detail hereinabove, the positive radiation-sensitive resin composition of the present invention, comprising the specific alkali-soluble resin(s), has high resolution to give resist patterns with good profiles and has high heat resistance and good storage stability.

While the invention has been described in detail and with reference to specific embodiments thereof, it will be apparent to one skilled in the art that various changes and modifications can be made therein without departing from the spirit and scope thereof.

What is claimed is:

1. A positive radiation-sensitive resin composition comprising a polymer(s) of formula (1) as a binder and a radiation-sensitive agent:

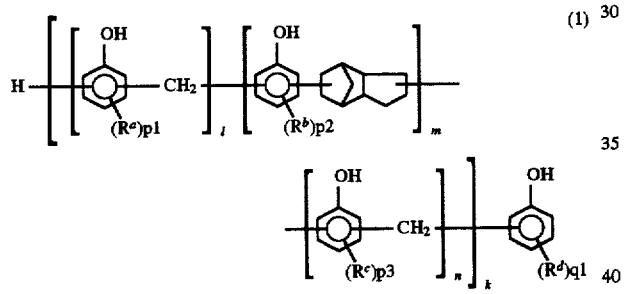

wherein $R^a$, $R^b$, $R^c$ and $R^d$ are the same or different and each represents a hydrogen atom, a hydroxyl group, a halogen atom, an alkyl group, an alkoxy group, an alkenyl group, an aryl group, an aralkyl group, an alkoxycarbonyl group, an arylcarbonyl group, an acyloxy group, an acyl group, or a cycloalkyl group;

k represents an integer of from 1 to 30;

(1+n) is an integer of from 1 to 100;

m represents an integer of from 1 to 50;

p1, p2 and p3 each represent an integer of from 1 to 3; and q1 represents an integer of from 1 to 4.

2. The positive radiation-sensitive resin composition of claim 1, wherein $R^a$, $R^b$, $R^c$ and $R^d$ each is selected from the group consisting of a chlorine atom, a bromine atom, an iodine atom, an alkyl group having from 1 to 4 carbon atoms, an alkoxy group having from 1 to 4 carbon atoms, an alkenyl group having from 2 to 4 carbon atoms, a phenyl group, a xylyl group, a toluyl group, a cumenyl group, a benzyl group, a phenethyl group, a cumyl group, a methoxycarbonyl group, an ethoxycarbonyl group, a benzoyloxy group, a butyryloxy group, an acetoxy group, a formyl group, an acetyl group, a butyryl group, a benzoyl group, a cyanamoyl group, a valeryl group, a cyclopentyl group, and a cyclohexyl group.

3. The positive radiation-sensitive resin composition of claim 1, wherein the composition contains the polymer of formula (1) in an amount of 10 to 50% by weight.

4. The positive radiation-sensitive resin composition of claim 1, wherein the polymer of formula (1) has a number average molecular weight of from 300 to 10,000.

5. The positive radiation-sensitive resin composition of claim 1, wherein the binder further comprises an alkali-soluble polymer.

6. The positive radiation-sensitive resin composition of claim 5, wherein the amount of the alkali-soluble polymer is 0.1 to 100 parts by weight per 100 parts by weight of the polymer of formula (1).

7. The positive radiation-sensitive resin composition of claim 1, wherein the amount of the radiation-sensitive agent is 0.1 to 100 parts by weight per 100 parts by weight of the binder.

8. The positive radiation-sensitive resin composition of claim 1, wherein the radiation-sensitive agent is selected from the group consisting of:

an oxazole derivative of formula (4) and a s-triazine derivative of formula (5):

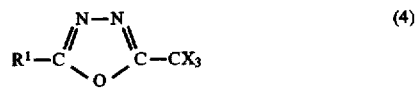

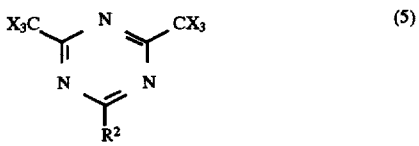

wherein $R^1$ represents a substituted or unsubstituted aryl or alkenyl group; $R^2$ represents a substituted or unsubstituted aryl, alkenyl or alkyl group, or —$CX_3$ where X represents a chlorine atom or a bromine atom; and a plurality of X may be the same or different, an iodonium salt of formula (6) and a sulfonium salt of formula (7):

wherein $Ar^1$ and $Ar^2$ each independently represent a substituted or unsubstituted aryl group; $R^3$, $R^4$ and $R^5$ each independently represent a substituted or unsubstituted alkyl or aryl group; $Z^-$ represents a pair anion; and two of $R^3$, $R^4$ and $R^5$, as well as $Ar^1$ and $Ar^2$ may be bonded to each other either directly or via a linking group, a disulfone derivative of formula (8) and an iminosulfonate derivative of formula (9):

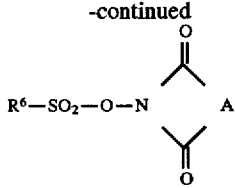
(9)

wherein $Ar^3$ and $Ar^4$ each independently represent a substituted or unsubstituted aryl group; $R^6$ represents a substituted or unsubstituted alkyl or aryl group; and A represents a substituted or unsubstituted alkylene, alkenylene or arylene group, and a diazo compound of formula (10):

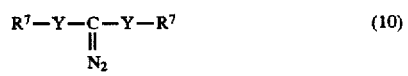
(10)

wherein Y represents —CO— or —SO$_2$—; $R^7$ represents a linear, branched or cyclic alkyl group having from 1 to 12 carbon atoms, or a substituted or unsubstituted aryl or aralkyl group.

9. The positive radiation-sensitive resin composition of claim 8, wherein at least one of $Ar^1$ and $Ar^2$ represents a substituted aryl group and the substituent is selected from the group consisting of an alkyl group having from 1 to 6 carbon atoms, a haloalkyl group having from 1 to 6 carbon atoms, a cycloalkyl group, an aryl group, an alkoxy group having from 1 to 6 carbon atoms, a nitro group, a carboxyl group, an alkoxycarbonyl group, a hydroxyl group, a mercapto group, and a halogen atom.

10. The positive radiation-sensitive resin composition of claim 8, wherein at least one of $R^3$, $R^4$ and $R^5$ represents a substituted aryl group and the substituent is selected from the group consisting of an alkoxy group having from 1 to 8 carbon atoms, an alkyl group having from 1 to 8 carbon atoms, a nitro group, a carboxyl group, a hydroxyl group, and a halogen atom, or at least one of $R^3$, $R^4$ and $R^5$ represents a substituted alkyl group and the substituted is selected from the group consisting of an alkoxy group having from 1 to 8 carbon atoms, a carboxyl group, and an alkoxycarbonyl group having from 2 to 9 carbon atoms.

11. The positive radiation-sensitive resin composition of claim 8, wherein at least one of $Ar^3$ and $Ar^4$ represents a substituted aryl group and the substituent does not contain more than 13 carbon atoms.

12. The positive radiation-sensitive resin composition of claim 8, wherein $R^6$ represents a substituted aryl group and the substituent does not contain.

13. The positive radiation-sensitive resin composition of claim 8, wherein $R^7$ represents a substituted aryl group or a substituted aralkyl group and the substituent does not contain more than 10 carbon atoms.

* * * * *